US011604242B2

(12) United States Patent
He

(10) Patent No.: US 11,604,242 B2
(45) Date of Patent: Mar. 14, 2023

(54) METHODS, SYSTEMS, AND COMPUTER READABLE MEDIA FOR IN VIVO PHASE INCREMENTING MAGNETIC RESONANCE SPECTROSCOPIC IMAGING (PI-MRSI) FOR MULTI-BIOMARKER IMAGING AND FOR SIMULTANEOUS IMAGING OF ZERO QUANTUM—>DOUBLE QUANTUM (ZQ—>DQ) AND DQ—>ZQ COHERENCE PATHWAYS

(71) Applicant: The University of North Carolina at Chapel Hill, Chapel Hill, NC (US)

(72) Inventor: Qiuhong He, Raleigh, NC (US)

(73) Assignee: THE UNIVERSITY OF NORTH CAROLINA AT CHAPEL HILL, Chapel Hill, NC (US)

( * ) Notice: Subject to any disclaimer, the term of this patent is extended or adjusted under 35 U.S.C. 154(b) by 0 days.

(21) Appl. No.: 17/479,270

(22) Filed: Sep. 20, 2021

(65) Prior Publication Data

US 2022/0091208 A1 Mar. 24, 2022

Related U.S. Application Data

(60) Provisional application No. 63/080,544, filed on Sep. 18, 2020.

(51) Int. Cl.
*G01R 33/485* (2006.01)
*G01R 33/565* (2006.01)
*G01R 33/36* (2006.01)

(52) U.S. Cl.
CPC ....... *G01R 33/485* (2013.01); *G01R 33/3607* (2013.01); *G01R 33/56554* (2013.01)

(58) Field of Classification Search
CPC .............. G01R 33/3607; G01R 33/485; G01R 33/56554
See application file for complete search history.

(56) References Cited

U.S. PATENT DOCUMENTS 8,731,635 B2 5/2014 He
9,285,443 B2 3/2016 He
(Continued)

OTHER PUBLICATIONS

Brown et al., "NMR chemical shift imaging in three dimensions", Natl. Acad. Sci., vol. 79, pp. 1-4 (Jun. 1982).
(Continued)

*Primary Examiner* — Gregory H Curran
(74) *Attorney, Agent, or Firm* — Jenkins, Wilson, Taylor & Hunt, P.A.

(57) ABSTRACT

Phase-incrementing MRSI (pi-MRSI) method has resolved overlapping biomarker images in the presence of a read-gradient. On a Bruker 9.4T MRI spectrometer, the pi-SEE-HSelMQC sequence was implemented. The choline-selective and lactate CH-selective RF pulses were phase incremented by 10° in opposite signs, synchronized with the phase-encoding steps. The lactate and choline images from a yogurt phantom displayed opposite image offsets without image overlapping. In vivo one-dimensional pi-SEE-HSelMQC CSI images of lactate and choline, acquired from the MDA-MB-231 human breast cancer xenograft in a nude mouse, as well as two-dimensional pi-SEE-HSelMQC imaging of lactate and choline acquired from the PC3 human prostate cancer xenograft in a nude mouse, also had opposite image offsets, shifted away from the spurious residual water signals in the image center. The pi-SEE-HSelMQC method completely suppresses lipid and water with potential clinical applications in disease diagnosis and therapeutic interventions.

24 Claims, 24 Drawing Sheets

(56) References Cited

U.S. PATENT DOCUMENTS

| | | | |
|---|---|---|---|
| 9,733,326 B2 | 8/2017 | He | |
| 9,915,714 B2 | 3/2018 | He | |
| 10,338,178 B2* | 7/2019 | Liang | G01R 33/485 |
| 2014/0296695 A1* | 10/2014 | He | A61B 5/4312 |
| | | | 324/318 |
| 2019/0204400 A1* | 7/2019 | Landheer | G01R 33/543 |

OTHER PUBLICATIONS

He et al., "Single-Scan in Vivo Lactate Editing with Complete Lipid and Water Suppression by Selective Multiple-Quantum-Coherence Transfer (Sel-MQC) with Application to Tumors", Journal of Magnetic Resonance, series B 106, pp. 1-9 (1995).

He et al., "Proton Detection of Choline and Lactate in EMT6 Tumors by Spin-Echo-Enhanced Selective Multiple-Quantum-Coherence Transfer", Journal of Magnetic Resonance, series B 112, pp. 1-8 (1996).

He et al., "Proton NMR Observation of the Antineoplastic Agent Iproplatin in Vivo by Selective Multiple Quantum Coherence Transfer (Sel-MQC)", pp. 1-3 (1995).

He et al., "In Vivo MR Spectroscopic Imaging of Polyunsaturated Fatty Acids (PUFA) in Healthy and Cancerous Breast Tissues by Selective Multiple-Quantum Coherence Transfer (Sel-MQC): A Preliminary Study", Magnetic Resonance in Medicine, pp. 1-7 (2007).

Zhu et al., "The Fast Spiral-SelMQC Technique for In Vivo Mr Spectroscopic Imaging of Polyunsaturated Fatty Acids (PUFA) in Human Breast Tissue", NIH Public Access, pp. 1-22 (Jan. 2012).

Andronesi est al., "Detection of 2-Hyroxyglutarate in IDH-mutated Glioma Patients by Spectral-editing and 2D Correlation Magnetic Resonance Spectroscopy", NIH Public Access, pp. 1-22 (Jan. 11, 2012).

Bogner et al., "3D GABA imaging with real-time motion correction, shim update and reacquistion of adiabatic spiral MRSI", NIH Public Access, pp. 1-32 (Dec. 2014).

Andronesi et al., "Treatment response assessment in IDH-mutant glimoma patient by non-invasive 3D functional Spectoscopic Mapping of 2-Hydroxyglutarate", HHS Public Access, pp. 1-22 (Apr. 1, 2016).

* cited by examiner

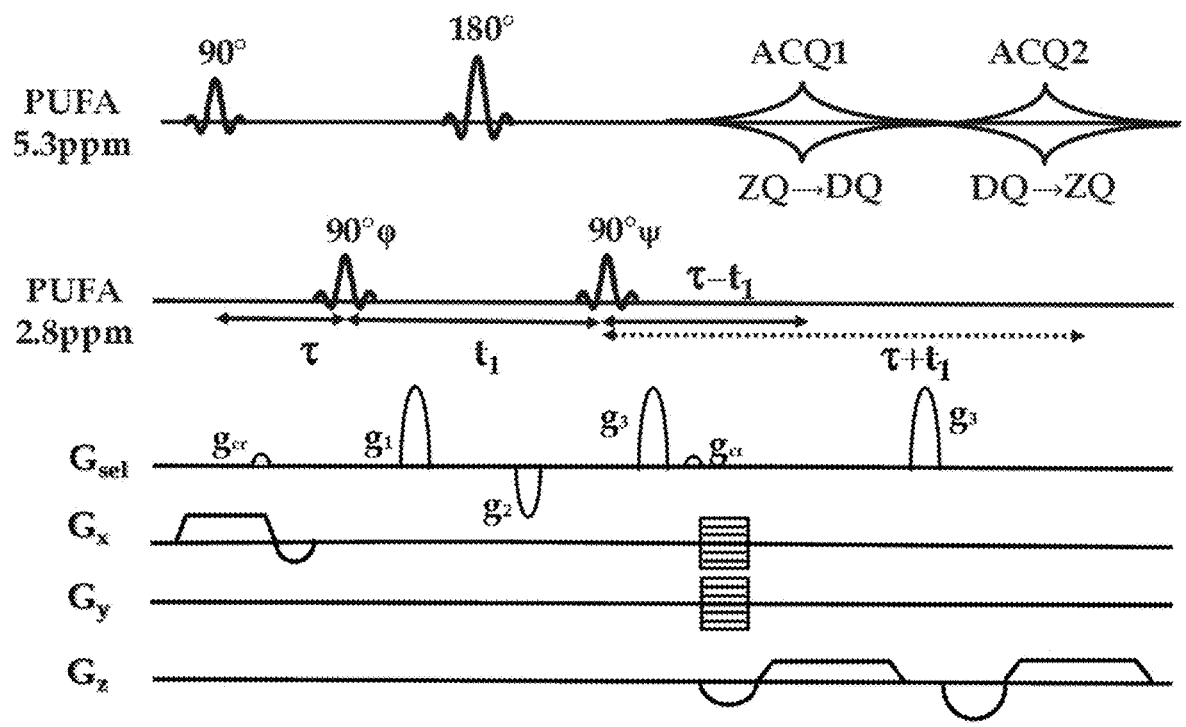
FIG. 10A
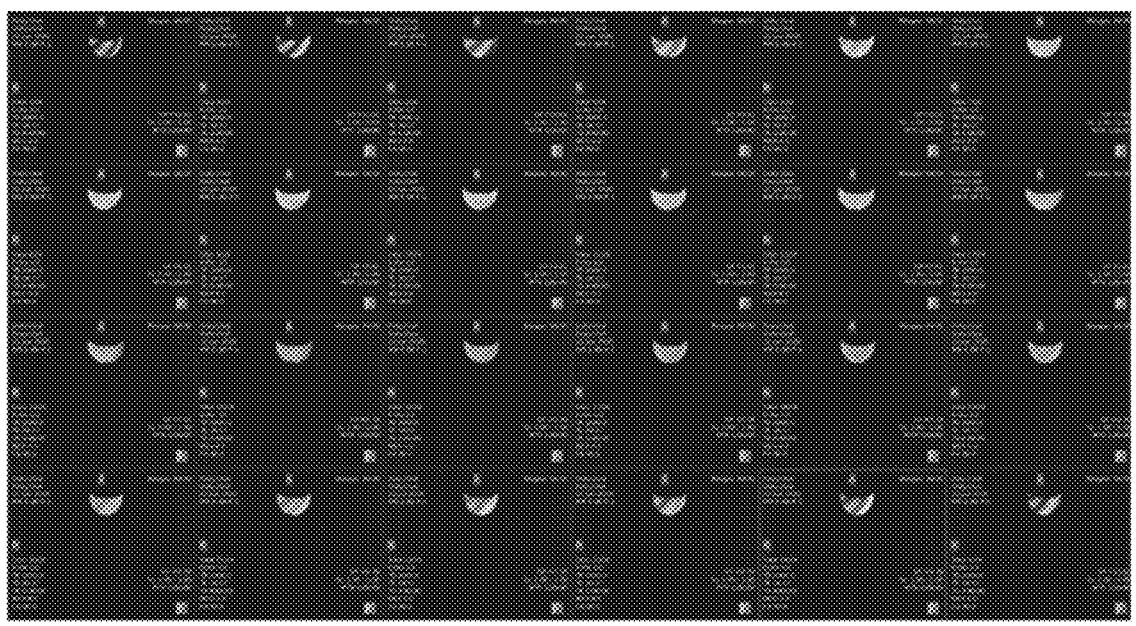
FIG. 10B(1)

FIG. 10B(2)

FIG.10D(1)
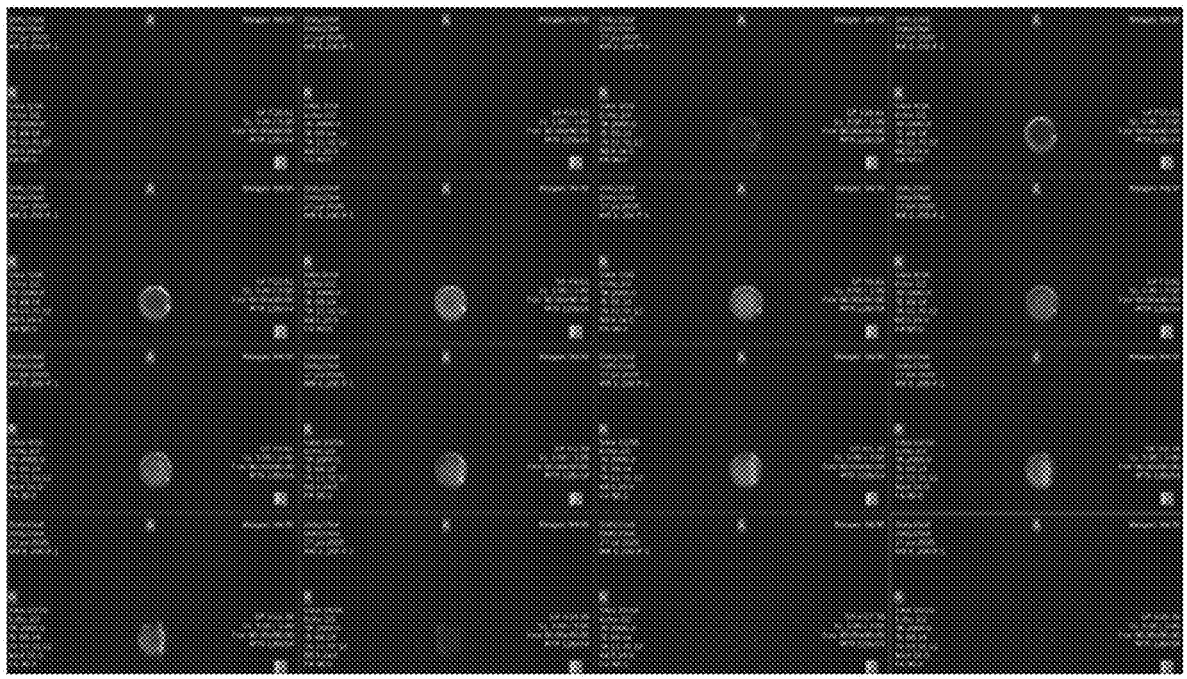
FIG. 10D(2)

METHODS, SYSTEMS, AND COMPUTER READABLE MEDIA FOR IN VIVO PHASE INCREMENTING MAGNETIC RESONANCE SPECTROSCOPIC IMAGING (PI-MRSI) FOR MULTI-BIOMARKER IMAGING AND FOR SIMULTANEOUS IMAGING OF ZERO QUANTUM→DOUBLE QUANTUM (ZQ→DQ) AND DQ→ZQ COHERENCE PATHWAYS

RELATED APPLICATIONS

This application claims the priority benefit of U.S. Provisional Patent Application Ser. No. 63/080,544 filed Sep. 18, 2020, the disclosure of which is incorporated herein by reference in its entirety.

TECHNICAL FIELD

The subject matter herein relates to MRSI imaging. More particularly, the subject matter described herein relates to methods, systems, and computer readable media for in vivo phase incrementing magnetic resonance spectroscopic imaging (PI-MRSI) for multi-biomarker imaging and for simultaneous imaging of ZQ→DQ and DQ→ZQ coherence pathways.

BACKGROUND

In MR spectroscopic imaging, samples are excited with RF pulses designed to produce signals caused by single-quantum transitions or multiple-quantum coherences induced in chemical compounds of interest. One problem that occurs during MRSI imaging is that spatial distributions of the signals generated by different compounds can overlap. To resolve overlapping biomarker MRSI images, Chemical Shift Imaging (CSI) techniques are frequently used. However, CSI is a very slow method of k-space mapping of biomarkers at low tissue concentration. Fast k-space mapping techniques were employed for single biomarker imaging but cannot be used for simultaneous imaging of multiple biomarkers due to image overlapping of different biomarkers. Accordingly, there is a need for a fast MRSI imaging technique that reduces imaging signal overlap between chemical compounds of interest.

Another problem that occurs in MRSI imaging using the Selective Multiple Quantum Coherence transfer (Sel-MQC) method for MRSI in tissues containing high mobile lipid is loss of biomarker signal due to the inability to simultaneously image DQ→ZQ and ZQ→DQ coherence pathways. In existing Sel-MQC imaging, only one of the coherence pathways can be imaged at a time, resulting in a loss of signal by a factor of one half. Accordingly, there exists a need for an improved MRSI imaging technique that allows simultaneous imaging of ZQ→DQ and DQ→ZQ coherence pathways for detecting biomarkers at low tissue concentration.

SUMMARY

Phase-incrementing Magnetic Resonance Spectroscopic Imaging (pi-MRSI) method has resolved overlapping biomarker images in the presence of read-gradient. On a Bruker 9.4T MRI spectrometer, the pi-SEE-HSelMQC sequence was implemented. The choline-selective and lactate CH-selective RF pulses were phase incremented by 10° in opposite signs, synchronized with the phase-encoding steps. The lactate and choline images from a yogurt phantom displayed opposite image offsets without image overlapping. In vivo one-dimensional pi-SEE-HSelMQC CSI images of lactate and choline, acquired from the MDA-MB-231 human breast cancer xenograft in a nude mouse, as well as the two-dimensional pi-SEE-HSelMQC images of lactate and choline acquired from the PC3 human prostate cancer xenograft in a nude mouse, also had opposite image offsets, shifted away from the spurious residual water signals in the image center. The pi-SEE-HSelMQC method completely suppresses lipid and water with potential clinical applications in disease diagnosis and therapeutic interventions. We have also demonstrated a version of 3D pi-SEE-SelMQC pulse sequences by applying an additional phase-encoding gradient in the direction of the slice-selective gradient. The PUFA and choline images were detected in multi-slices of a two-compartment phantom containing soybean oil in the outer tube compartment and 50 mM choline in saline in the inner syringe compartment.

A novel phase-incrementing soft Selective Multiple Quantum Coherence Transfer (pi-SSelMQC) method was developed to detect full Sel-MQC spectroscopic imaging signals of biomarkers in vivo with excellent water and lipid suppression. For demonstration, the pi-SSelMQC experiments were carried out to map lactate spatial distributions in a yogurt phantom and in vivo in murine 344SQ lung tumors grown subcutaneously on the right thigh of syngeneic 129X1/SvJ male mice. Both ZQ→DQ and DQ→ZQ coherence transfer pathways were detected by synchronizing the phase-encoding gradient steps and RF phase increments of the selective MQ-excitation pulse (or the selective MQ→SQ transfer pulse). The lactate images from the two different MQ-coherence pathways were detected with opposite imaging offsets away from spurious residual signals of unwanted biochemicals, recovering the 50% lost signal in Sel-MQC. We have also demonstrated a version of 3D pi-SSelMQC pulse sequences by applying an additional phase-encoding gradient in the direction of the slice-selective gradient. The PUFA images were detected in multi-slices of a 15 mL conical tube containing soybean oil.

A method for in vivo phase incrementing magnetic resonance spectroscopic imaging (MRSI) includes applying frequency-selective RF pulses at frequencies in a first set of frequencies to a radio frequency (RF) coil of a magnetic resonance imaging (MRI) spectrometer to induce a single-quantum transition(s) or multiple-quantum coherences in a first chemical substance(s) in a subject. The method further includes applying frequency selective RF pulses at frequencies in a second set of frequencies to the RF coil to induce a single-quantum transition(s) or multiple-quantum coherence(s) in a second chemical substance(s) in the subject. The method further includes applying a phase encoding gradient to the gradient coils to phase encode signals generated by the multiple quantum coherences or the single-quantum transitions induced in first and second chemical substances as a result of the frequency-selective pulses at the frequencies in the first and second sets of frequencies, wherein applying the phase encoding gradient includes varying an amplitude and direction of the phase encoding gradient. The method further includes, synchronously with the signal phase changes induced by the phase encoding gradient, phase incrementing phases of the frequency-selective pulses at the frequencies in the first set of frequencies and phase decrementing or incrementing by a different amount (i.e., different from the phase increments of the frequency selective pulses at the frequencies in the first set of frequencies) phases of the frequency selective pulses at the frequencies in the second set of frequencies. The method further includes detecting, during an image acquisition period, signals generated by the induced multiple quantum coherences or single-quantum transitions in the first and second chemical substances as a result of the phase incremented RF pulses at the frequencies in the first set of frequencies, the differently phase incremented or phase decremented RF pulses at the frequencies in the second set of frequencies, and the phase encoding gradient.

A method for simultaneous detection of zero quantum-→double quantum (ZQ→DQ) and DQ→ZQ coherence transfer pathways in a chemical substance of interest includes applying a pulse sequence to a radio frequency (RF) coil of a magnetic resonance imaging (MRI) spectrometer to induce a quantum coherence(s) in a chemical substance in a subject. The method further includes applying a phase encoding gradient to the gradient coils to phase encode signals from the multiple-quantum coherences induced in a chemical substance as a result of the pulse sequence, wherein applying the phase encoding gradient includes varying the amplitude and direction of the phase encoding gradient. The method further includes synchronously with the amplitude or direction in the phase encoding gradient, phase incrementing the phase of an RF pulse in the pulse sequence. The method further includes simultaneously detecting, during an image acquisition period(s), signals generated resulting from DQ→ZQ and ZQ→DQ quantum transfer pathways in the chemical substance.

The subject matter described herein may be implemented in hardware, software, firmware, or any combination thereof. As such, the terms "function" "node" or "module" as used herein refer to hardware, which may also include software and/or firmware components, for implementing the feature being described. In one exemplary implementation, the subject matter described herein may be implemented using a computer readable medium having stored thereon computer executable instructions that when executed by the processor of a computer control the computer to perform steps. Exemplary computer readable media suitable for implementing the subject matter described herein include non-transitory computer-readable media, such as disk memory devices, chip memory devices, programmable logic devices, and application specific integrated circuits. In addition, a computer readable medium that implements the subject matter described herein may be located on a single device or computing platform or may be distributed across multiple devices or computing platforms.

BRIEF DESCRIPTION OF THE DRAWINGS

FIG. 1A illustrates pi-SEE-HSelMQC imaging pulse sequence with a read gradient applied during acquisition period for frequency-encoding and the corresponding phase encoding gradient in the second dimension of k-space encoding. FIG. 1B illustrates the corresponding pi-SEE-HSelMQC CSI imaging pulse sequence with additional phase encoding gradients as a replacement of the read-gradient for spatial localization. The RF phases of the choline- and lactate CH-selective 90° pulses were incremented in opposite signs, synchronized with the phase-encoding steps. Different imaging offsets were introduced for choline and lactate images to resolve image overlapping, shifting them away from spurious signals. The same principle applies to choline and PUFA imaging[6,7];

FIG. 4A illustrates an individual spectrum containing lactate signal from the 1D CSI stack plot. In FIG. 4B, only lactate was detected at the shifted lactate imaging offset away from residual water signal. Choline signal was dephased and not detectable;

In FIG. 6A, the frequency-encoding gradient is applied during the image acquisition period. FIG. 6B illustrates the corresponding CSI pulse sequence with additional phase encoding gradients as a replacement of the read-gradient for spatial localization. Synchronized increments of the RF phase of a lactate CH-selective 90° pulse with the phase-encoding steps induce opposite image offsets for separation of PUFA or lactate images from the two different MQ-coherence transfer pathways;

FIG. 10A illustrates is a pulse sequence diagram for a multi-slice pi-SSelMQC pulse sequence. An additional phase encoding gradient applied in the slice-gradient direction defines multi-slices;

FIGS. 10B(1) and 10B(2) illustrate preliminary 3D pi-SSelMQC data from a double echo experiment acquiring PUFA images from both DQ→ZQ and ZQ→DQ pathways to recover full PUFA signals from the soybean oil in a 15 mL conical tube, respectively, using the 25 mm Doty volume coil on a Bruker 9.4T MRI spectrometer. Number of slices=24 in axial orientation as defined in FIG. 10C using the standard Bruker localization images acquired from the oil sample. Slice thickness=1 mm. FOV=60×60×24 mm$^3$, Image size: 128×90×24 mm$^3$, with an in-plane resolution of 0.5 mm×0.67 mm of each PUFA image. Number of scans=4. The image artifacts can be removed by fine-tuning the pulse sequence parameters and optimizing the refocusing and spoiling gradient amplitudes. The multi-slice capability of the pi-SSel-MQC is clearly demonstrated by the results in FIGS. 10B(1) and 10B(2);

FIGS. 10D(1) and 10D(2) illustrate lactate images from 16 slices in a non-fat yogurt in 20 mL syringe acquired in a 3D pi-SSelMQC experiment on the 9.4T MRI scanner from (1) the ZQ→DQ coherence transfer pathways (echo 1/2) and (2) the DQ→ZQ coherence transfer pathways (echo 2/2). Again, the Doty 25 mm volume coil was used. Image matrix size=128×54×16 and FOV=90×90×48 mm$^3$. The slice thickness=3 mm, and in-plane resolution=0.703 mm×1.667 mm×3 mm. RT=2000 ms, Scan time=11 hr 31 min 12 s. A Gauss pulse of 8.05 ms was used as the frequency selective 90° and 180° pulse with an excitation bandwidth of 200 Hz. The 90° slice selective pulse was a Bruker calculated SLR pulse of 1.05 ms with an excitation bandwidth of 4000 Hz. The spectral bandwidth=6313.1 Hz. Repetition delay=2 sec, Receiver gain=101. Number of echo images=2. Read Orientation=Left-Right. MQ-preparation time=68 ms. The MQ-selection gradients $g_1:g_2:g_3$=−18:15: −30 and Crusher Gradient $g_{cr}$=−12, which all have a duration of 1.2 ms. The phase encoding gradient duration=0.420 ms in both slice selection direction ($G_x$) and phase encoding direction ($G_y$). Only the phase encoding gradient $G_y$ was synchronously incremented with the RF phase increment steps. The acquisition duration was 20.27 ms, during which read gradients ($G_z$) were applied. The transmitter frequency was set at 1.3 ppm or at an offset to water resonance of −1360 Hz. Thus, the selective 180° pulse on lactate $CH_3$ proton has an offset of 0 Hz, and selective 90° pulse on lactate CH proton has an offset of 1160 Hz. A TR spoiler gradient was applied between each scan;

DETAILED DESCRIPTION

This document is divided into two sections. The first section relates to in vivo phase incrementing MRSI for multi-biomarker imaging and describes experiments where lactate and choline MRSI images were obtained with reduced overlap between the images. The second section discusses simultaneous detection of ZQ→DQ and DQ→ZQ pathways in phase incrementing selective multiple quantum coherence transfer MRSI.

In Vivo Phase Incrementing MRSI for Multi-Biomarker Imaging

Introduction

As a powerful imaging modality, MRI obtains anatomical and functional information using water protons. MR data acquisitions are accompanied with read-gradient(s) for frequency encoding or non-Cartesian k-space mapping. In MR spectroscopic imaging of multiple biochemicals, magnetic field gradients are not often applied during data acquisition time to avoid image overlapping. In Chemical Shift Imaging (CSI), for instance, additional phase encoding gradients are applied for spatial mapping without read-gradient.[1] The CSI approach was adopted in our development of the selective multiple-quantum coherence transfer (Sel-MQC),[2] the spin-echo enhanced Sel-MQC (SEE-SelMQC),[3] and the Molecular-Specific Coherence Sel-MQC (MSC-SelMQC)[4] methods for spectroscopic imaging in tissues containing high level of mobile lipid. Metabolites,[2,3] anti-neoplastic agents,[5] and polyunsaturated fatty acids (PUFA)[6,7] were successfully detected in mouse tumor models, healthy human breast tissues and human breast cancer. With additional phase-encoding steps, the CSI experiments require substantially longer scan time than MRI. To speed up MRSI for clinical applications, we have employed spiral k-space mapping technique for PUFA imaging.[7] In this section, we report a novel phase-incrementing MRSI (pi-MRSI) approach for fast imaging of multiple metabolites without signal overlapping in the presence of magnetic field gradient during data acquisition period.

Methods

Figure 1A:
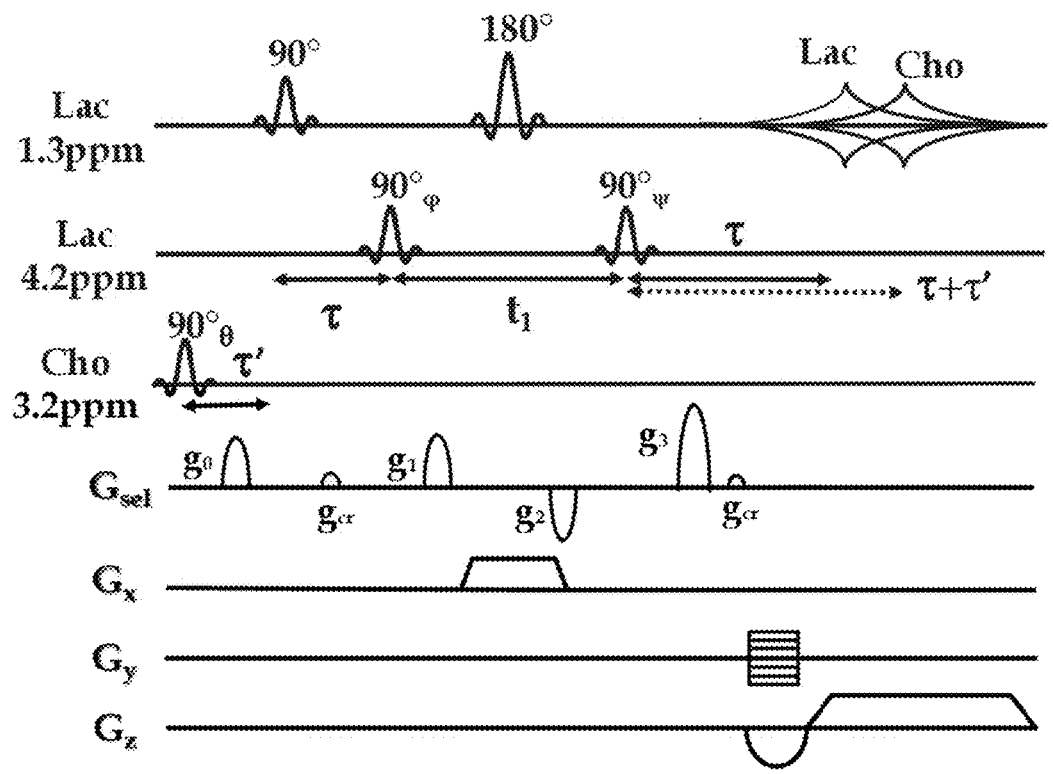
FIGS. 1A and 1B are pulse sequence diagrams illustrating exemplary excitation and gradient pulses used in phase incrementing MRSI for multi-biomarker imaging. In particular.
Figure 1B:
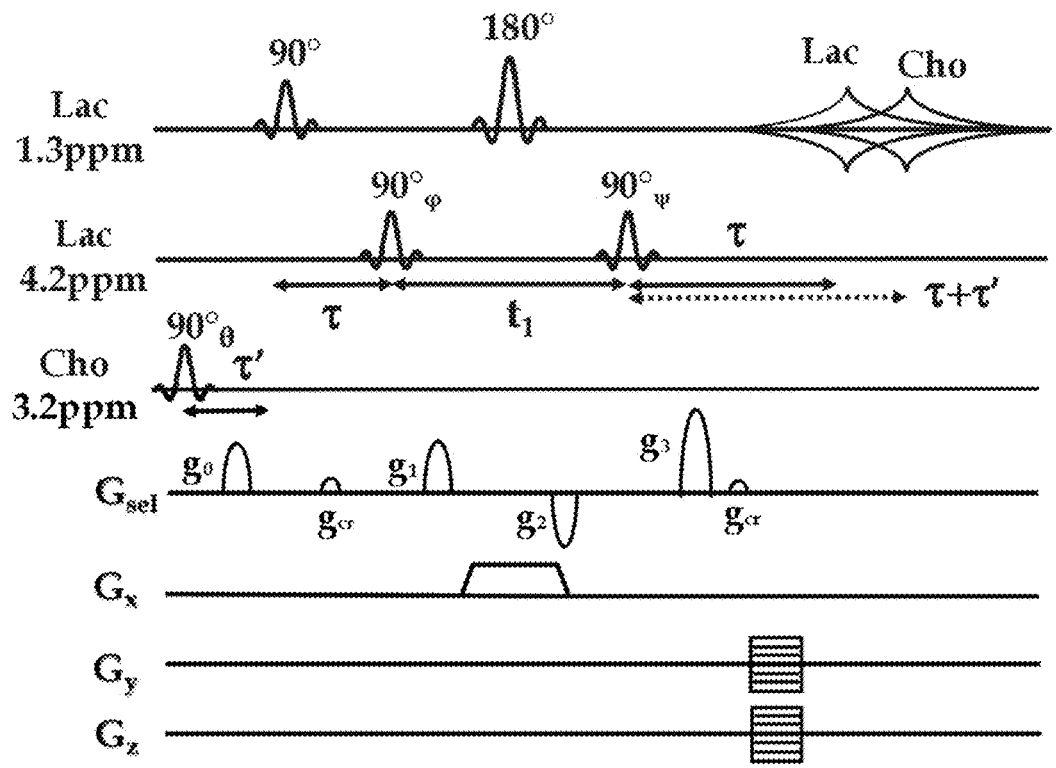

The pi-MRSI principle was demonstrated for multi-biomarker imaging using the phase incrementing SEE-SelMQC (pi-SEE-HSelMQC) method on a Bruker 9.4T BioSpec 94/30USR MRI spectrometer (AVII PV 6.0.1). The system has a BFG-240/120-S13B shielded gradient (12 cm bore size) with the maximum gradient of 999.63, 1,001.9, and 1,001.6 mT/m in x-, y-, and z-directions, respectively. In the exemplar lactate (or PUFA) and choline pi-MRSI experiments, a read-gradient was applied for frequency-encoding (FIG. 1A). A slice-selective 180° pulse was applied for slice selection as in the Hard Sel-MQC (HSel-MQC) method.[3] In synchronization with the phase encoding steps, the RF phases of the choline-selective 90° pulse (θ) at 3.2 ppm and the lactate-CH selective 90° pulse (ψ) at 4.2 ppm for MQ transfer to SQ modes [or alternatively the lactate CH-selective 90° pulse (φ) for MQ-preparation] were incremented by −10° and 10°, respectively. This introduced opposite image offsets to lactate and choline signals to resolve any image overlapping of the two biomarkers in the presence of the read gradient during data acquisition. We have also carried out the corresponding pi-SEE-HSelMQC CSI experiments (FIG. 1B) to observe the imaging offsets introduced to lactate, choline and PUFA signals.

Results

Figure 2A:
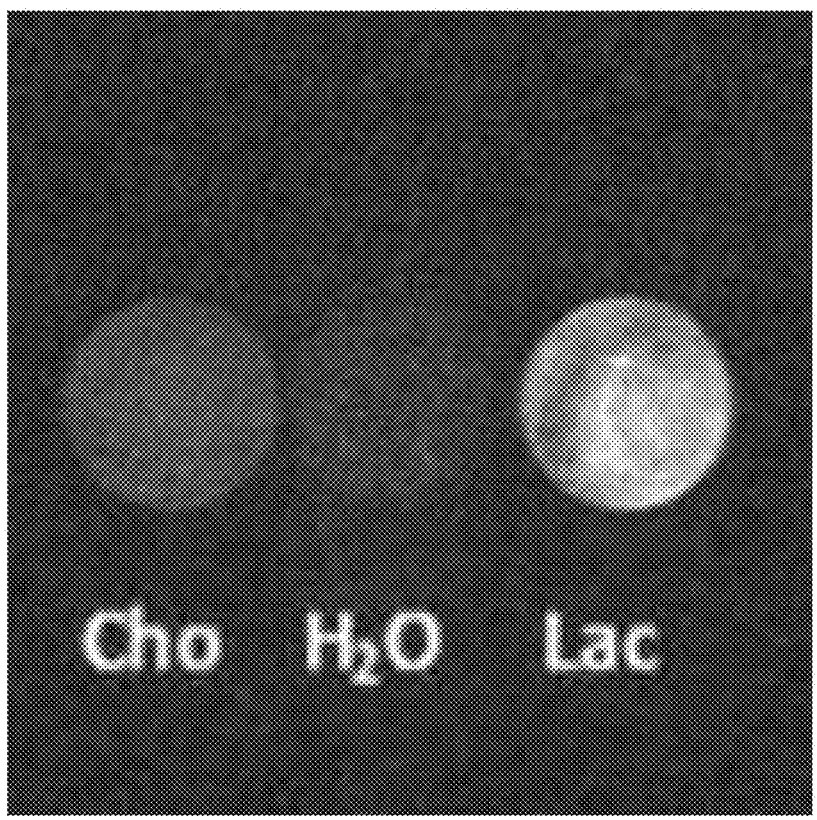
FIG. 2A illustrates 2D pi-SEE-HSelMQC CSI images of choline and lactate in the Yogurt phantom. The CSI image was extracted from the entire chemical shift range including water, choline and lactate. The choline and lactate were shifted from the image center with opposite imaging offsets, away from the spurious residual water image.
Figure 2B:
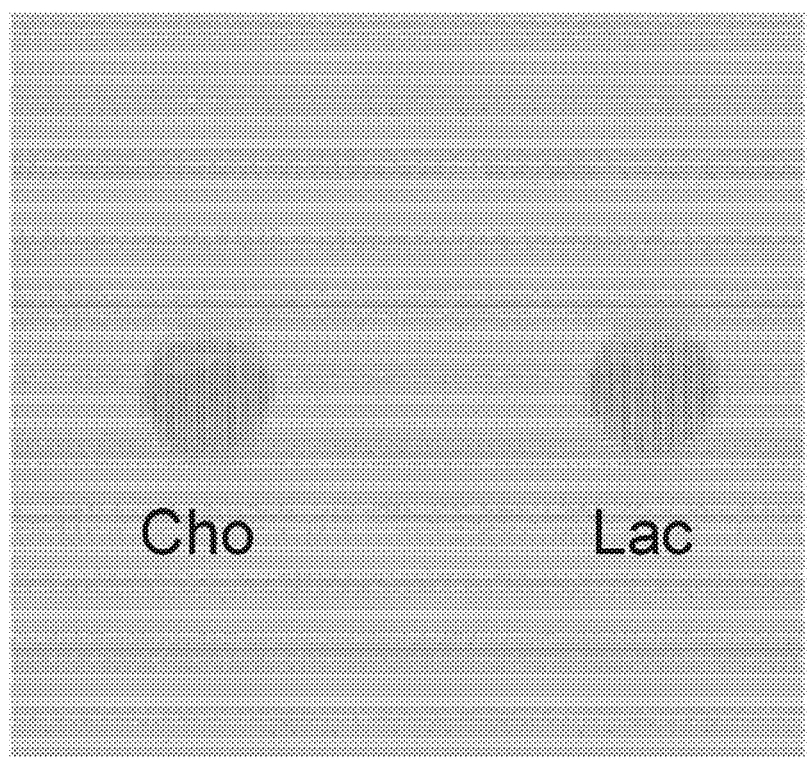
FIG. 2B illustrates the corresponding 2D CSI stack plot without including water resonance in the displayed chemical shift range.
Figure 2C:
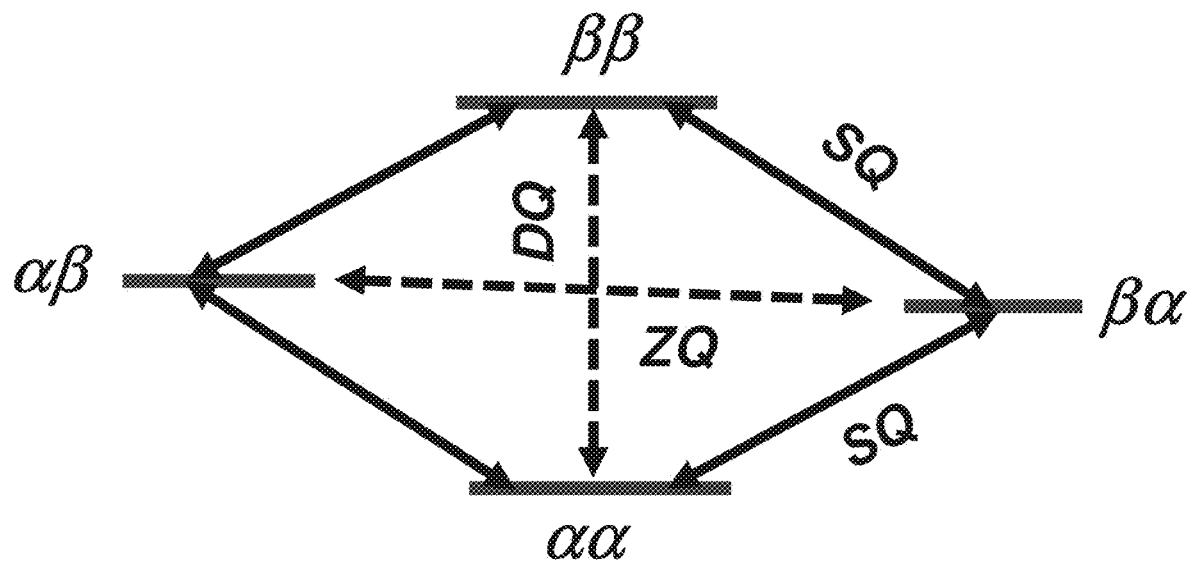
FIG. 2C illustrates the multilevel system of J-coupled protons α and β permits the Sel-MQC excitation of lactate or PUFA into the DQ and ZQ-modes in the pi-SEE-HSelMQC pulse sequence[3] for lactate or PUFA editing with water & lipid suppression.
Figure 2D:
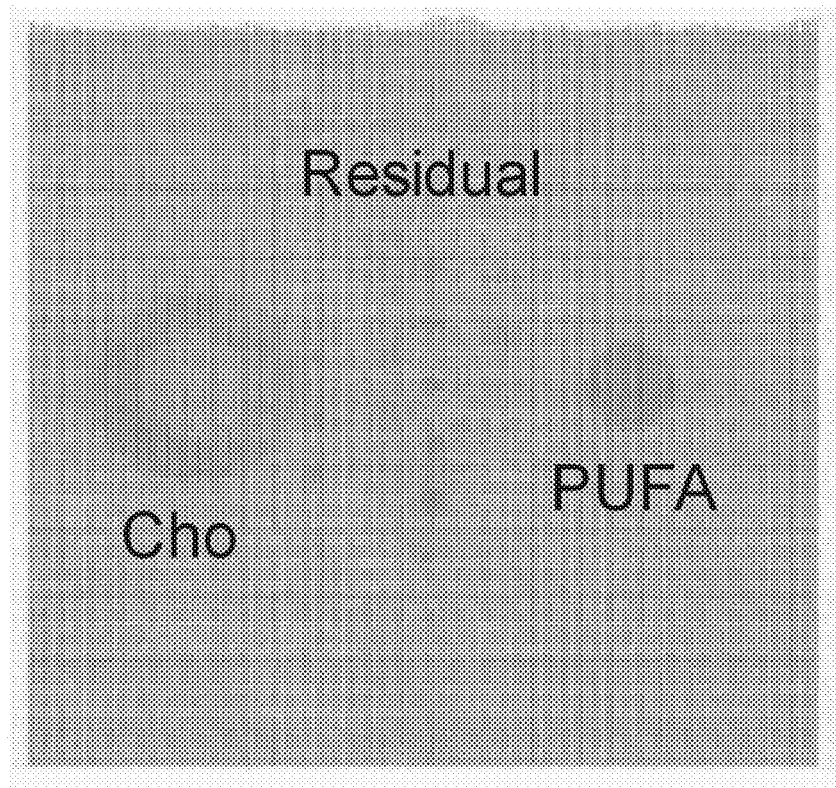
FIG. 2D illustrates the 2D pi-SEE-HSelMQC CSI imaging of choline and PUFA in two separate chambers of the concentric tube phantom. The PUFA protons at 5.3 ppm are J-coupled to the PUFA protons at 2.8 ppm. The MQ-coherences of PUFA were selected in Sel-MQC editing, whereas signals from other lipid molecules and water were suppressed. Choline resonance at 3.2 ppm was selectively excited to form a spin echo.

The 2D pi-SEE-HSelMQC CSI images of choline and lactate were obtained from fresh Dannon whole milk yogurt in a 50 mL conical tube using the Bruker 35 mm quadrature volume coil. Opposite choline and lactate imaging offsets were introduced in the phase-encoding direction, shifting choline and lactate images away from the residual water in the image center (FIG. 2A). In the 2D CSI stack plotting, we displayed only choline and lactate images without residual water in the chemical shift range (FIG. 2B). Water suppression was achieved by the Sel-MQC sequence component for lactate or PUFA editing based on the multi-level spin system (FIG. 2C).[2,3] In a separate experiment using a phantom made of two concentric tubes containing 1M choline in saline solution in the outer chamber and soybean oil in the inner tube, a strong choline image was detected in the outer chamber and the PUFA signal in the inner tube (FIG. 2D). Slice thickness=20 mm. PUFA and choline images were shifted in opposite directions due to synchronized RF phase increments and phase encoding steps, away from the spurious signals from residual water or unwanted lipid.

Figure 3A:
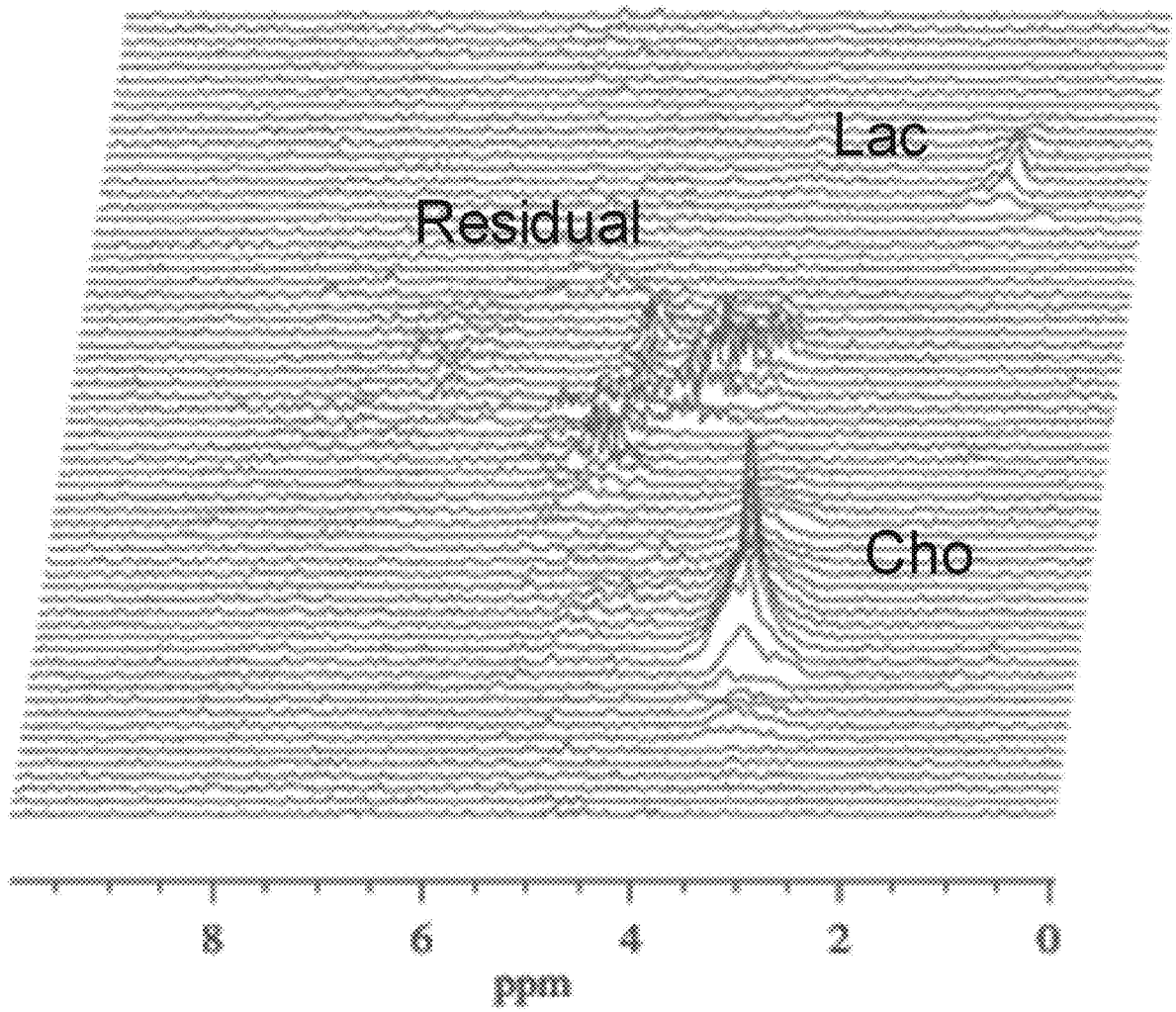
FIG. 3A illustrates an in vivo 1D pi-SEE-HSelMQC CSI stack plot of lactate and choline spectra detected in an MDA-MB-231 tumor on a nude mouse. From a 9 mm coronal slice covering the entire tumor, lactate and choline signals were detected with opposite imaging shifts in opposite directions in the phase encoding dimension, away from the residual water signal.
Figure 3B:
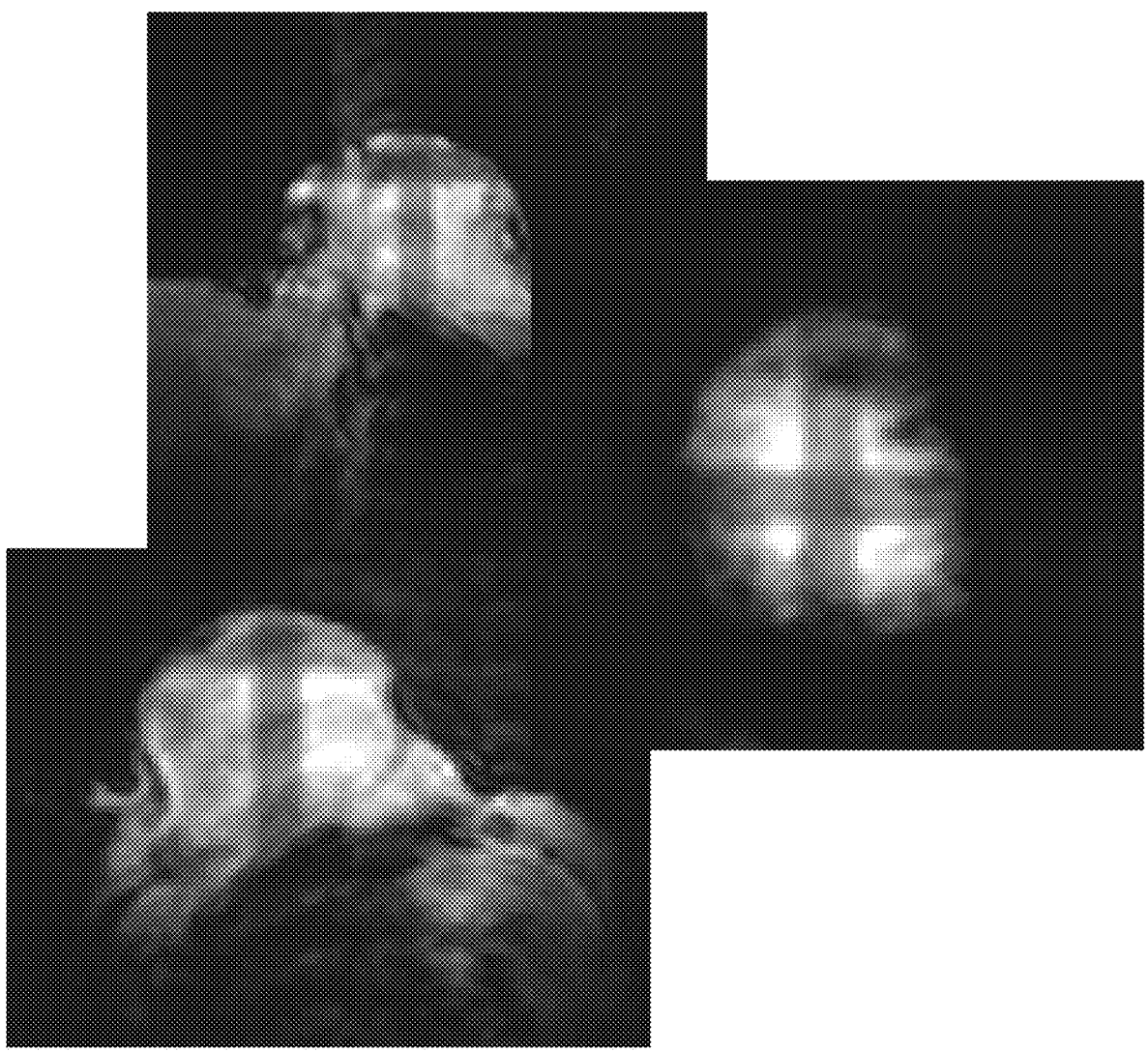
FIG. 3B illustrates three tumor across-sectional images obtained from the Bruker localizer sequence. A home-made gap resonator was used.
Figure 3C:
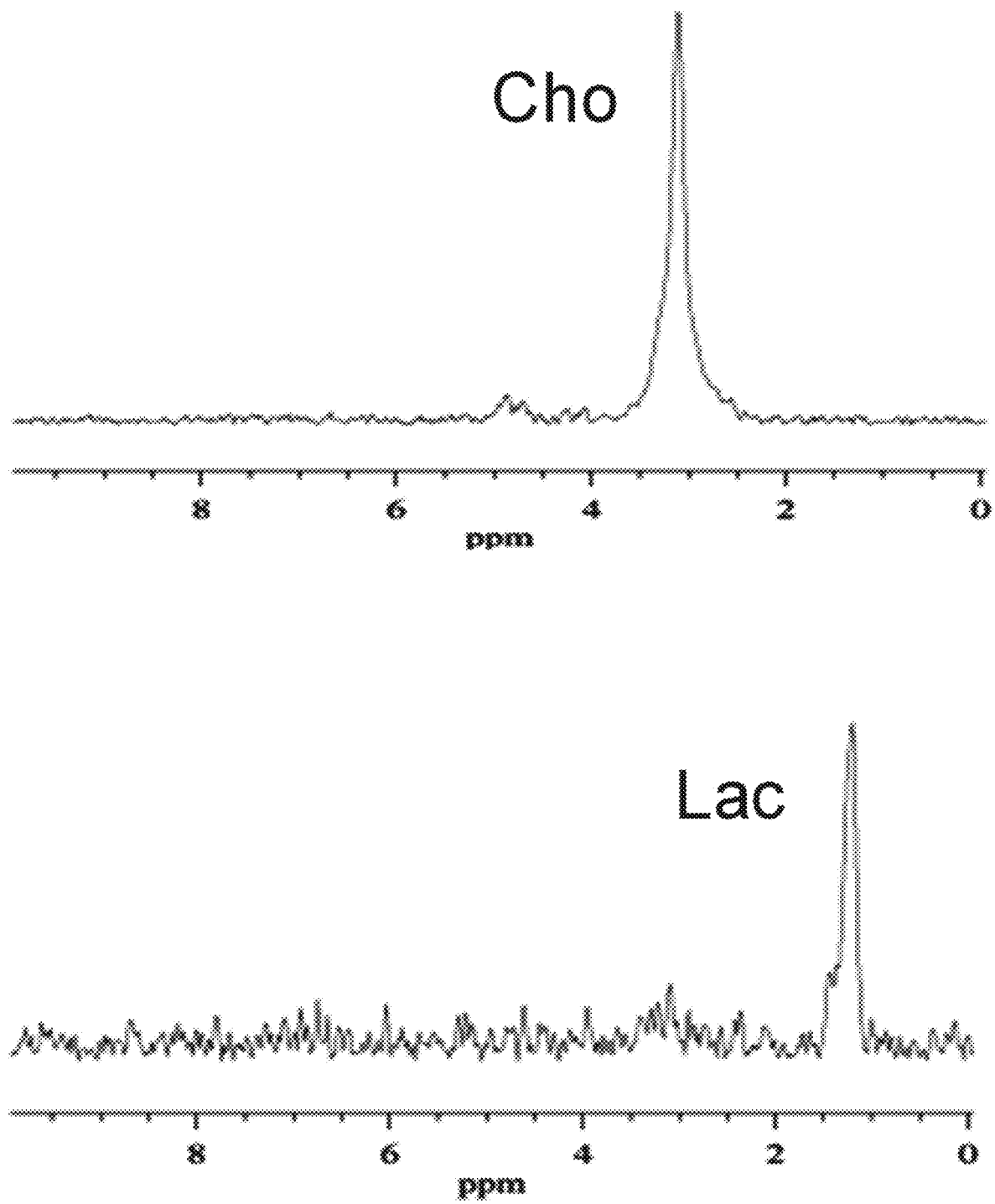
FIG. 3C illustrates the individual spectra of lactate and choline from the 1D pi-SEE-HSelMQC CSI stacked plot in FIG. 3A.
Figures 4A, 4B:
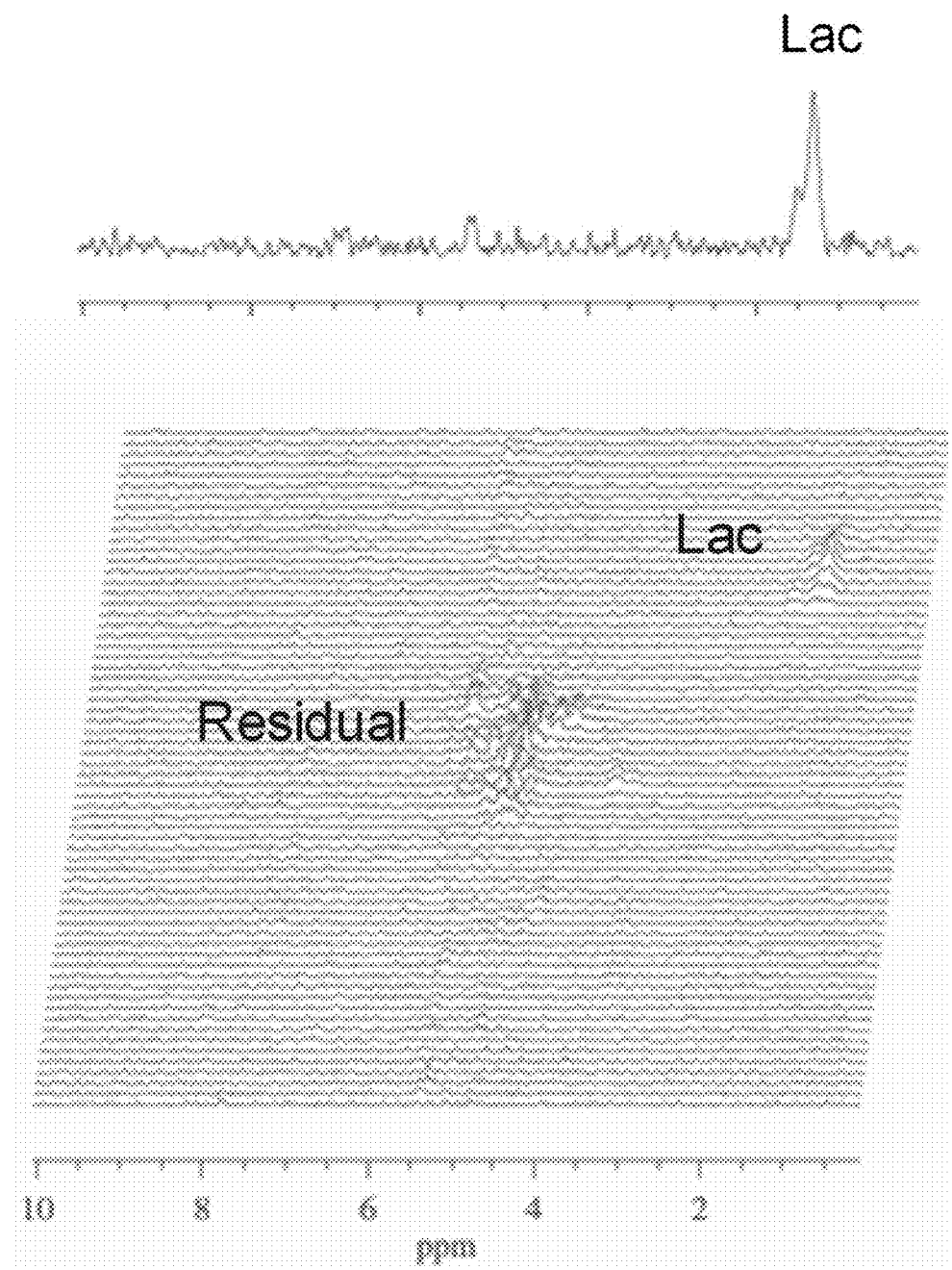
FIGS. 4A and 4B illustrate the in vivo control pi-SEE-HSelMQC CSI experiment to detect lactate without choline echo formation with gradient ratio $g_0:g_1:g_2:g_3=0:0:-15\%:30\%$ for the same tumor, without changing other MR parameters.

In an in vivo 1D pi-SEE-HSelMQC CSI experiment, an orthotopic MDA-MB-231 human mammary adenocarcinoma xenograft tumor was studied with a home-made RF gap resonator fitting the tumor size of 13.15 mm×10.61 mm×9.19 mm (FIGS. 3A-3C and 4A-4B). The tumor lactate and choline spectra presented opposite image offsets in the phase encoding direction, away from the residual spurious water signal at the image center in the 1D CSI phase encoding dimension (FIG. 3A). The choline-selective and MQ-coherence gradient ratio was $g_0:g_2:g_3$=15%:0:−15%:30%. In a control experiment, we set $g_0:g_2:g_3$=0:0:−15%:30% without refocusing choline signal. As expected, only lactate was detected in the control 1D pi-SEE-HSelMQC experiment (FIGS. 4A and 4B).

Figure 5A:
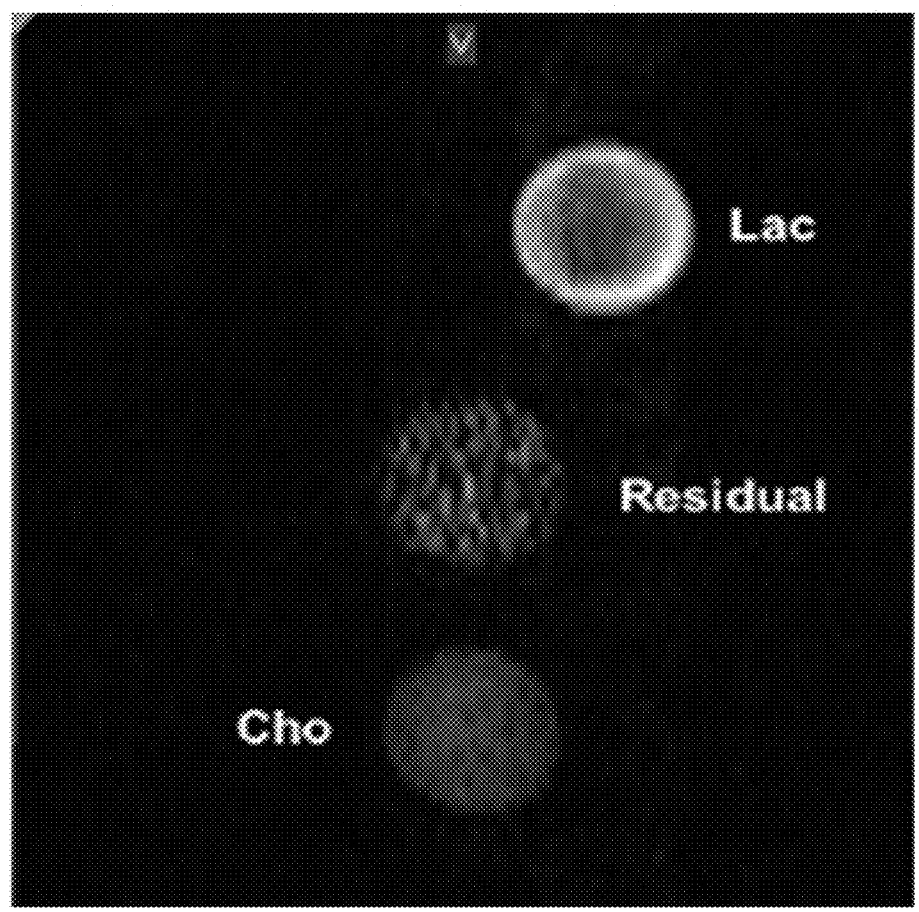
FIG. 5A illustrates that the resolved pi-SEE-HSelMQC images of lactate (Lac) and choline (Cho) from the yogurt phantom were shifted in opposite imaging offsets away from the residual water image with excellent water suppression. Number of scans=1; Scan time=1.48 min, dramatically shortened as compared to the CSI based MRSI. Image size=128×72; FOV=128×144 mm$^2$.
Figure 5B:
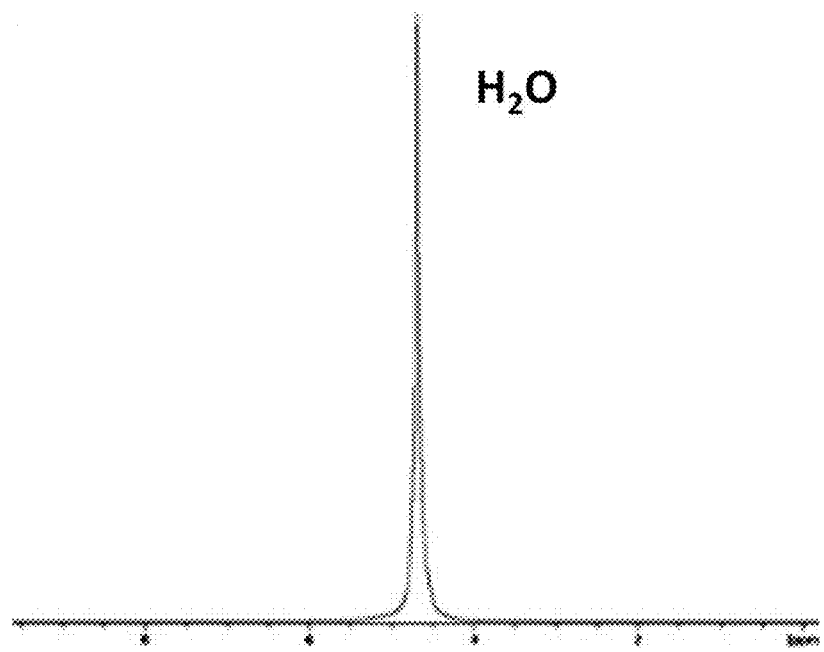
FIG. 5B illustrates that the 1D NMR spectrum of the yogurt sample at 9.4T is dominated by the water peak.
Figure 5C:
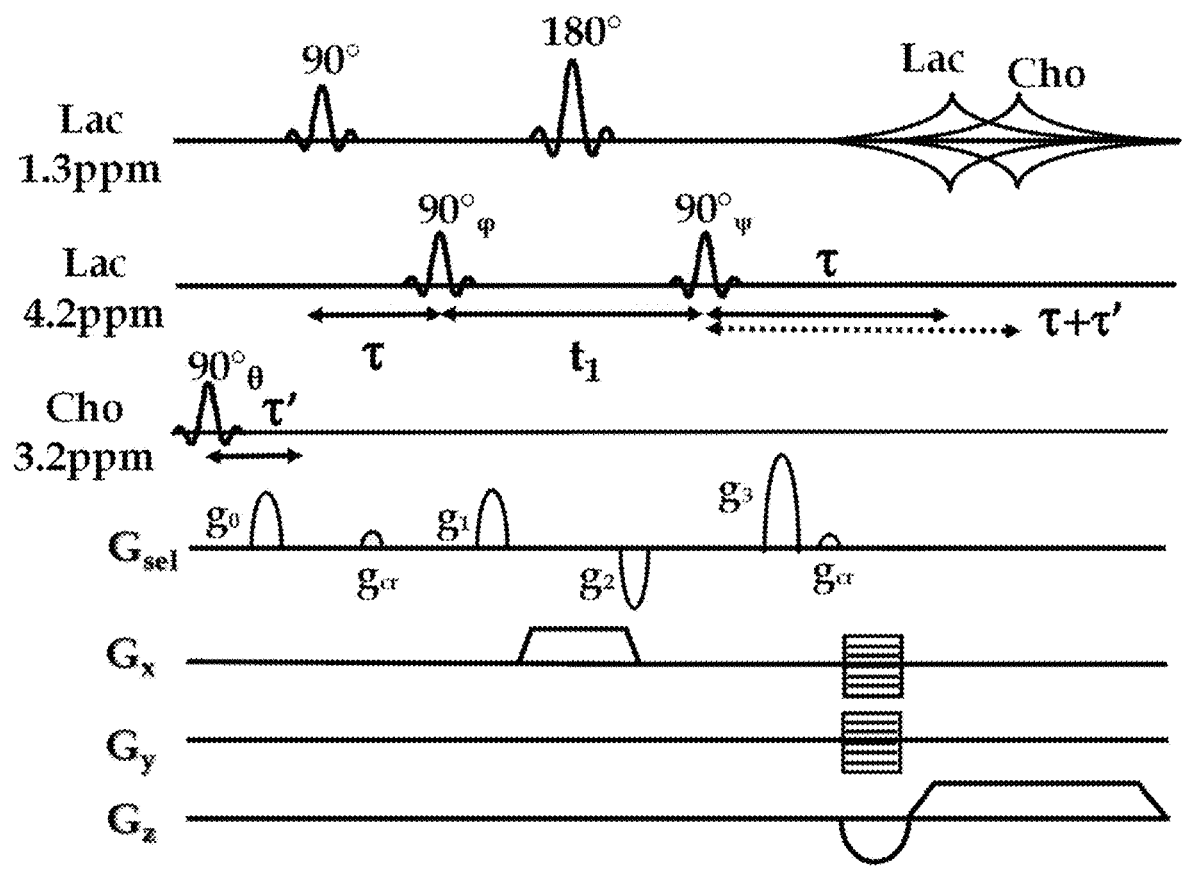
FIG. 5C illustrates the 3D multi-slice pi-SEE-HSelMQC imaging pulse sequence with an additional phase-encoding gradient applied in the direction of the slice-selective gradient.
Figure 5D:
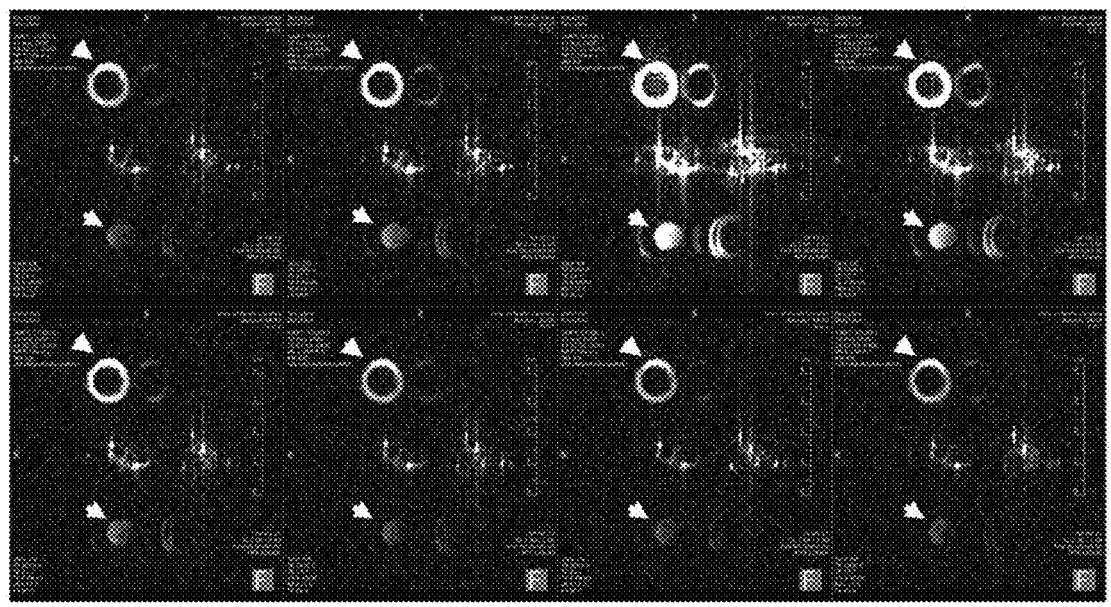
FIG. 5D illustrates preliminary results of 3D pi-SEE-HSelMQC imaging of PUFA (arrow head) and choline (arrow) from a two-compartment phantom composed of an inner 1 mL syringe containing 50 mM Cho in saline and an outer chamber containing soybean oil. Number of Slices=8, slice thickness=2 mm. Matrix size=128×90×8, FOV=90 mm×90 mm×16 mm.

Applying the pi-SEE-HSelMQC imaging method with read-gradient during data acquisition time for frequency encoding (FIG. 1A), we obtained lactate and choline images from the yogurt phantom in 50 mL conical tube. The RF phases of the choline-selective 90° pulse (θ) at 3.2 ppm and the last lactate-CH selective 90° pulse (ψ) at 4.2 ppm for MQ-transfer to SQ-modes [or alternatively the first lactate CH-selective 90° MQ-preparation pulse (φ)] were respectively incremented by −10° and 10° in opposite signs, synchronized with the spatial phase encoding steps. Again, opposite image offsets were introduced to resolve imaging overlap of lactate and choline signals by shifting lactate and choline images to different locations on the MRSI image (FIG. 5A). Excellent water and lipid suppression was achieved. The yogurt proton NMR spectrum was dominated by a strong water signal (FIG. 5B). The central spurious image originated from residual water may be completely suppressed by stronger MQ-coherence selection gradients. Bandwidth=10 kHz; FOV=128×144 mm2; image matrix size=128×72. $T_1$ relaxation delay=1.5 s. The pi-MRSI scan took 1.48 min, much faster than the corresponding 2D CSI experiments. A slice-selective 180° pulse functioned the same way as in the Hard Sel-MQC (HSel-MQC) method.[3] The multi-slice imaging version of the pi-HSelMQC can be obtained in various ways as in any 3D MRI experiments. For example, a phase-encoding gradient can be applied in the direction of the slice-selection gradient for simultaneous imaging of multiple biomarkers in multiple slices (FIG. 5C). A preliminary 3D pi-SEE-HSelMQC experiment was carried out using a two chamber phantom with the inner 1 mL syringe containing 50 mM choline in saline and outer 15 mL conical tube containing soybean oil (FIG. 5D). The choline (arrow) and PUFA (arrow head) from two tubes are shifted away from the image center in multiple axial slices. Number of Slices=8 and the slice thickness=2 mm. We will optimize the pulse sequence parameters and sample shimming to remove unwanted signals, which are not overlapping with the PUFA and choline images.

Conclusion

By synchronizing the biomarker-selective RF phase increments and the spatial phase encoding steps, the pi-MRSI method has resolved overlapping biomarker MR images in the presence of read gradient. The novel fast 3D pi-MRSI imaging of multiple biomarkers with Cartesian and non-Cartesian k-space mapping have many potential clinical applications in human disease diagnosis and monitoring therapeutic interventions.

The disclosure of each of the following references is hereby incorporated herein by reference in its entirety.

REFERENCES

1. Brown T R, et al., "NMR chemical shift imaging in three dimensions," Proc Natl Acad Sci USA. 1982 June; 79 (11):3523-26.
2. Qiuhong He, et al, "Single Scan In Vivo Lactate Editing with Complete Lipid and Water Suppression by Selective Multiple Quantum Coherence Transfer with Application in Tumors," J. Magn. Reson., Series B 106, 203-11 (1995).
3. Qiuhong He et al., "Proton Detection of Choline and Lactate in EMT6 Tumors by Spin-Echo-Enhanced Selective Multiple-Quantum-Coherence Transfer," J. Magn. Reson., Series B 111, 18-25 (1996).
4. Qiuhong He, "Simultaneous mapping of multiple chemicals with suppression of unwanted signals via molecular specific coherence (MSC)-SelMQC (selective multiple quantum coherence)." U.S. Pat. No. 9,285,443.
5. Qiuhong He, et al., "Proton NMR Observation of the Antineoplastic Agent Iproplatin In Vivo by Selective Multiple Quantum Coherence Transfer (Sel-MQC)," Magn. Reson. Med. 33, 414-16 (1995).
6. Qiuhong He, et al., "In vivo MR spectroscopic imaging of polyunsaturated fatty acids (PUFA) in healthy and cancerous breast tissues by selective multiple-quantum coherence transfer (Sel-MQC): A preliminary study," Magn. Reson. Med. 58, 1079-1085 (2007).
7. Zhu, et al., "The fast spiral-SelMQC technique for in vivo MR spectroscopic imaging of polyunsaturated fatty acids in human breast tissue," Magn. Reson. Med. 67, 8-19 (2012).

Simultaneous Detection of ZQ→DQ and DQ→ZQ Pathways in Phase-Incrementing SSel-MQC (Pi-SSelMQC) with Application to Recover Lost Tumor Marker Signals Introduction The Selective Multiple-Quantum Coherence Transfer (Sel-MQC) Methods were developed to resolve overlapping $^1$H NMR resonances for in vivo biomarker detection. It has been applied to map spatial distributions of lactate buried under the intense water and lipid peaks in biological tissues containing high fat content,[1] and detect antineoplastic agent Iproplatin overlapping with lactate and lipid resonances in mouse tumors[2] and poly unsaturated fatty acids (PUFA) in human breast cancer.[3,4] Previously, we have developed the modified Sel-MQC sequences to detect multiple biomarkers,[5] and the Sel-ZQC methods to remove magnetic susceptibility artifacts in biological tissues.[6] To achieve single-scan water and lipid suppression in the Sel-MQC experiments, however, half of the biomarker signals is lost since we selectively detect only one of the ZQ→DQ and DQ→ZQ pathways.[1] In this report, we present a novel phase-incrementing soft Sel-MQC (pi-SSelMQC) method for simultaneous detection of both ZQ→DQ and DQ→ZQ pathways to recover the 50% lost biomarker signal by synchronizing the phase-encoding gradient steps and the RF phase increments of the selective RF pulses for MQ-excitation or MQ-detection.

Methods

Figure 6A:
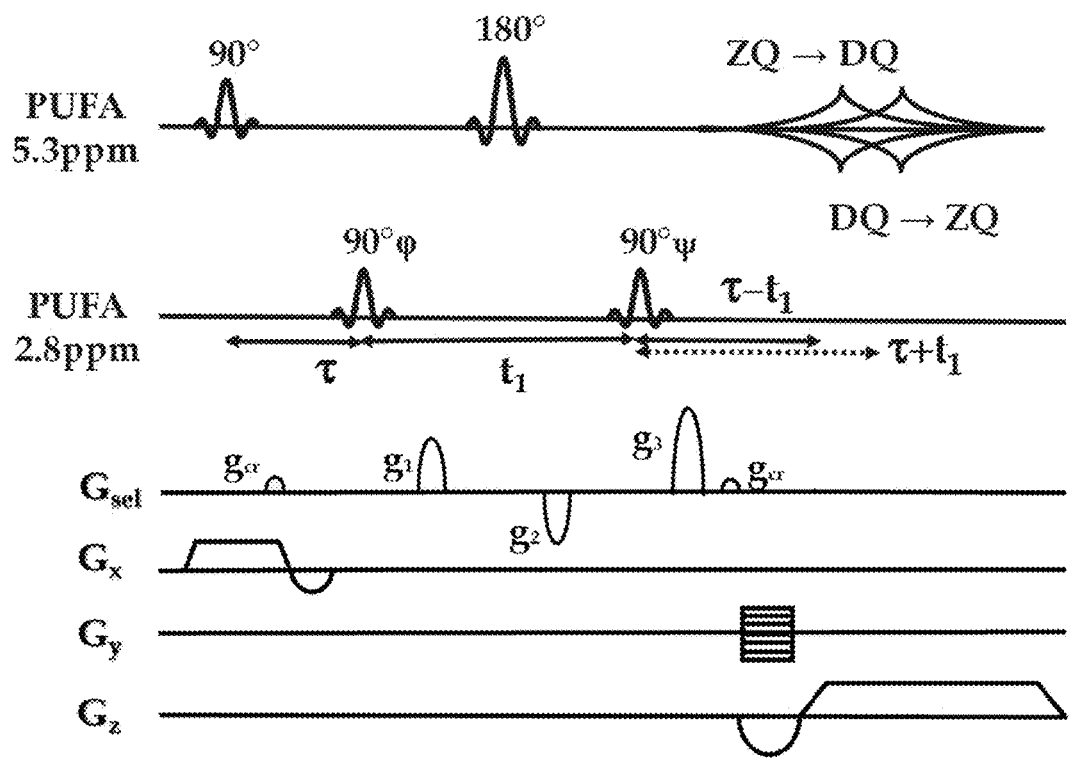
FIGS. 6A and 6B illustrate the pi-SSelMQC imaging pulse sequence.
Figure 6B:
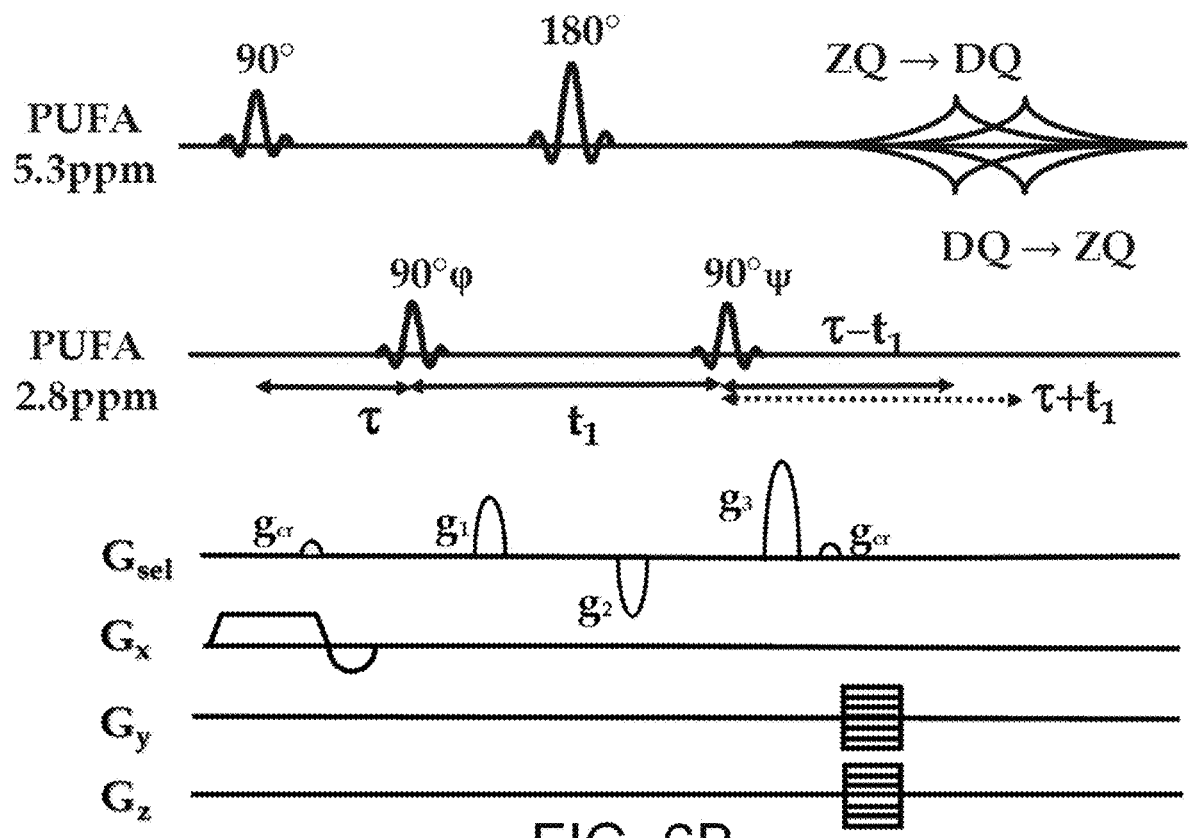

We have modified the SSel-MQC method by incrementing the RF phase of the second 90° pulse, which excites the MQ-coherences, in synchronization with the phase encoding gradient steps in the fast pi-SSelMQC spectroscopic imaging experiment with application of read-gradient(s) (FIG. 6A) and the pi-SSelMQC chemical shift imaging (CSI) experiments (FIG. 6B). Alternatively, RF phase incrementing the last 90° pulse, which converts the MQ-coherences into the detectable single-quantum (SQ) signals, produces similar effects. Since the coherence order of the DQ→ZQ and ZQ→DQ coherence transfer pathways have opposite signs, this procedure gives biomarker images from the two different MQ-coherence transfer pathways with opposite offset shifts away from the unwanted signals including residual water and lipid resonances. Thus, simultaneous detection of both DQ→ZQ and ZQ→DQ pathways has been achieved, permitting full recovery of the biomarker signals in vivo (FIGS. 7-10).

Results

Figure 7A:
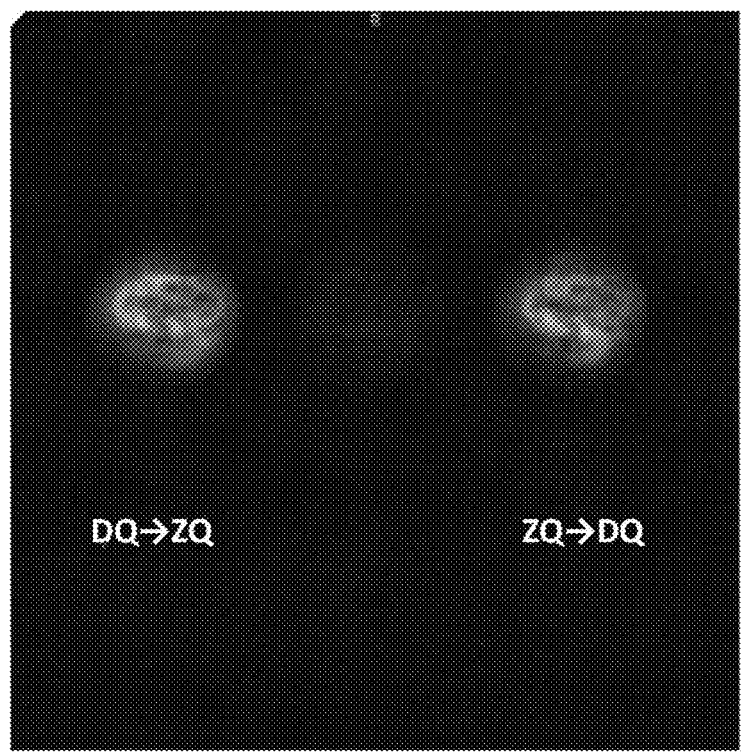
FIG. 7A illustrates the 2D pi-SSelMQC CSI measurement from a yogurt phantom in a 50 ml conical tube. Full lactate CSI signals are recovered from both ZQ→DQ and DQ→ZQ coherence transfer pathways, which are shifted in opposite directions away from the spurious signals at the image center.
Figure 7B:
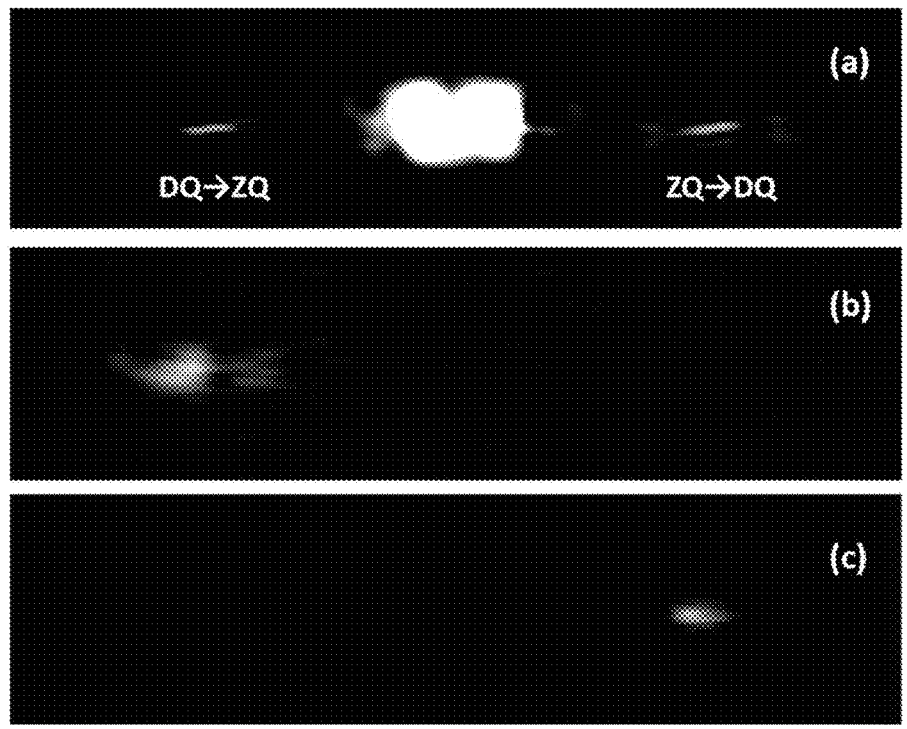
FIG. 7B illustrates the 1D pi-SSelMQC CSI measurement of the lactate signal from 344SQ murine lung cancer in a live mouse from both MQ coherence pathways (a) or (b) DQ→ZQ and (c) ZQ→DQ pathways separately.
Figure 7C:
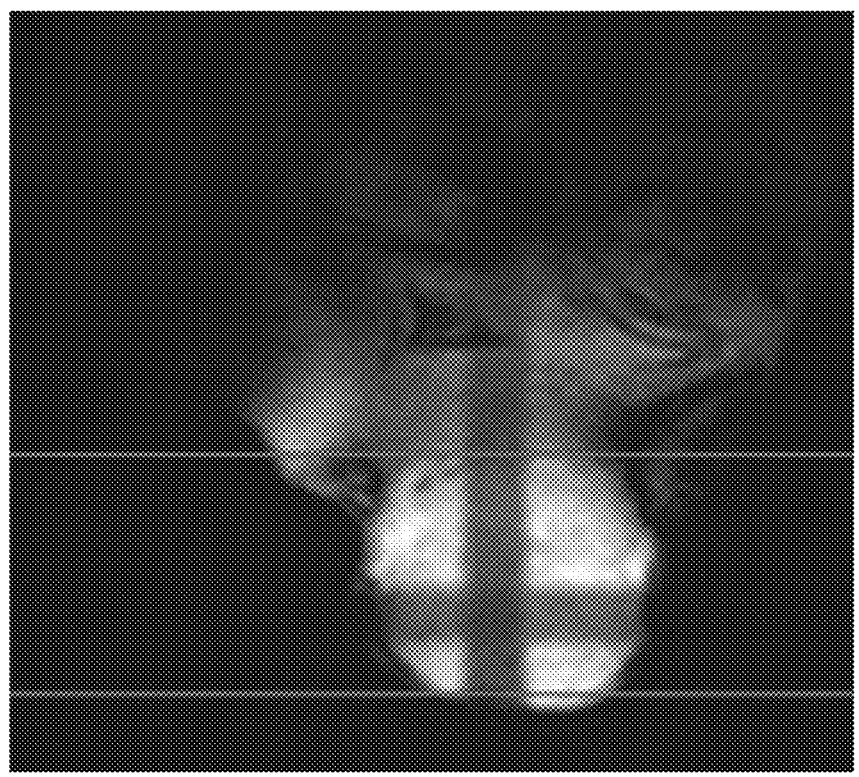
FIG. 7C illustrates the setup of a single slice localization on the tumor image acquired from the Bruker localizer sequence.
Figure 7D:
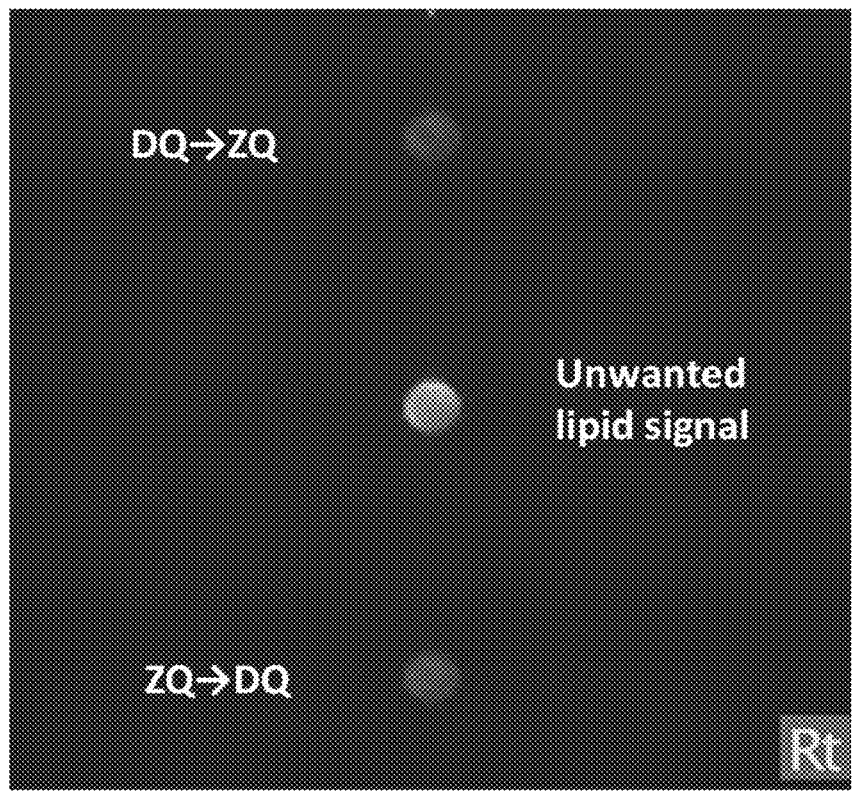
FIG. 7D illustrates the PUFA image shifts in the CSI images from the two different MQ-coherence transfer pathways in a phantom containing soybean oil. The PUFA signals from the ZQ→DQ and DQ→ZQ coherence pathways shifted in opposite directions from the spurious non-PUFA lipid signals in soybean oil.
Figure 7E:
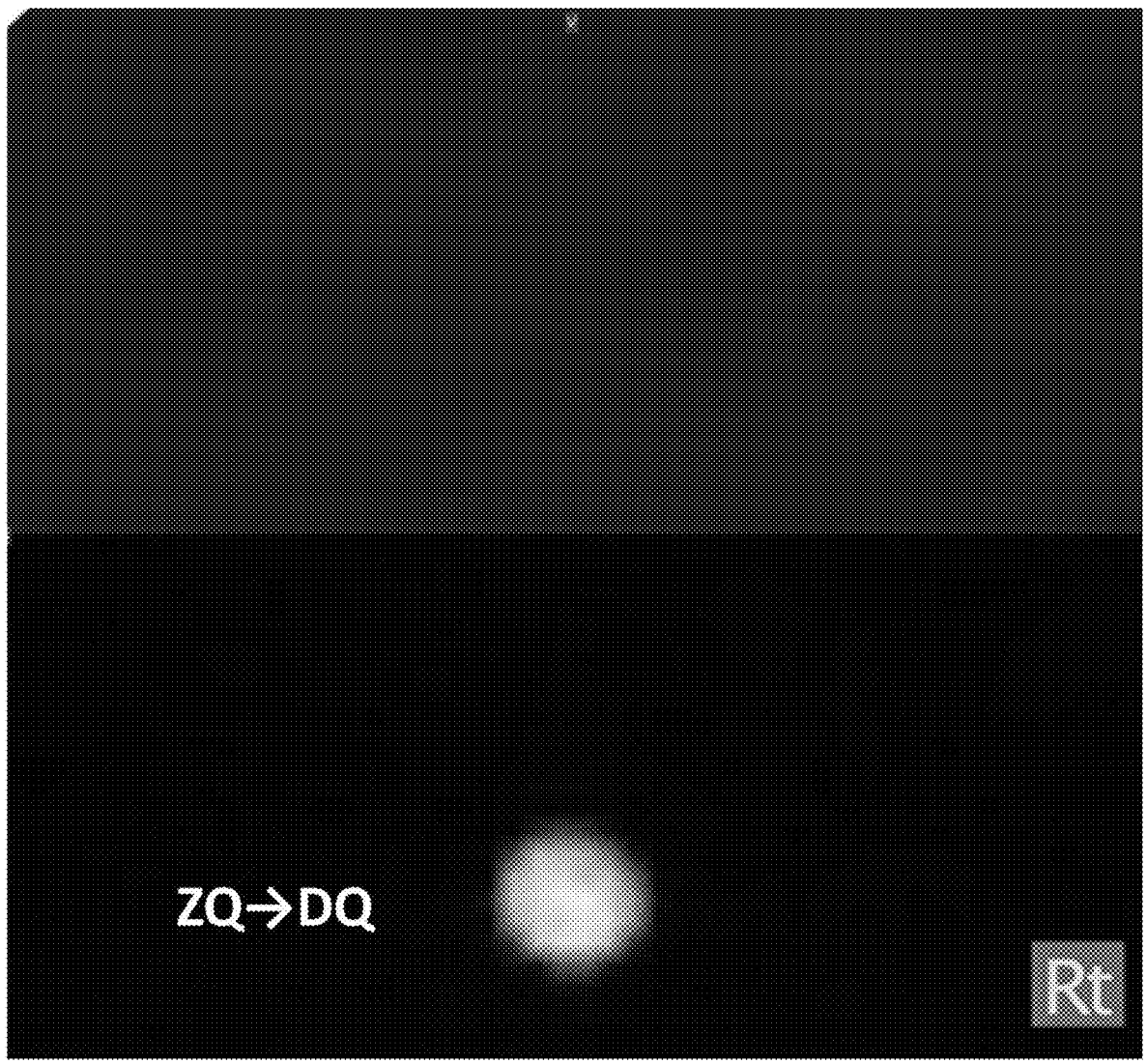
FIG. 7E illustrates the PUFA CSI image from the ZQ→DQ pathway with excellent suppression of spurious non-PUFA lipid signals as a control experiment. The pi-SSelMQC CSI pulse sequence of FIG. 6B was employed.

The pi-SSelMQC pulse sequences were implemented on a Bruker 9.4T BioSpec 94/30USR AVII MRI spectrometer. The system has the BFG-240/120-S13B shielded gradients (12 cm bore size) with Integrated Shims (Resonance Research, Inc) and the maximum gradient strengths of 999.63, 1,001.9, and 1,001.6 mT/m respectively in x-, y- and z-directions. We detected yogurt lactate signals from both the DQ→ZQ and ZQ→DQ coherence transfer pathways (FIG. 7A) in a two-dimensional (2D) pi-SSelMQC CSI experiment (FIG. 6B) using a gap resonator RF coil. In one-dimensional (1D) CSI experiments using a single loop RF coil, we have observed tumor lactate signals in vivo in a mouse lung cancer model simultaneously from both DQ→ZQ and ZQ→DQ coherence pathways [(FIG. 7B(a)], and separately from either DQ→ZQ [FIG. 7B(b)] or ZQ→DQ [FIG. 7B(c)] coherence pathway in a coronal slice covering the entire tumor (FIG. 7C). The mouse tumor was grown into 10.73 mm×10.72 mm×8.63 mm size after inoculating mouse lung cancer 344SQ cells (0.5 million in 100 μl of serum-free medium) subcutaneously in the right thigh region of the syngeneic 129X1/SvJ male mice. Similarly, using the Bruker 35 mm Quadrature RF volume coil, we have recovered full 2D PUFA CSI signals from both DQ→ZQ and ZQ→DQ pathways (FIG. 7D), as well as signals from only one MQ pathway (FIG. 7E), in a phantom made of soybean oil in 50 mL conical tube.

Double-Echo Pi-SSelMQC with Excellent Lipid and Water Suppression

Figure 8A:
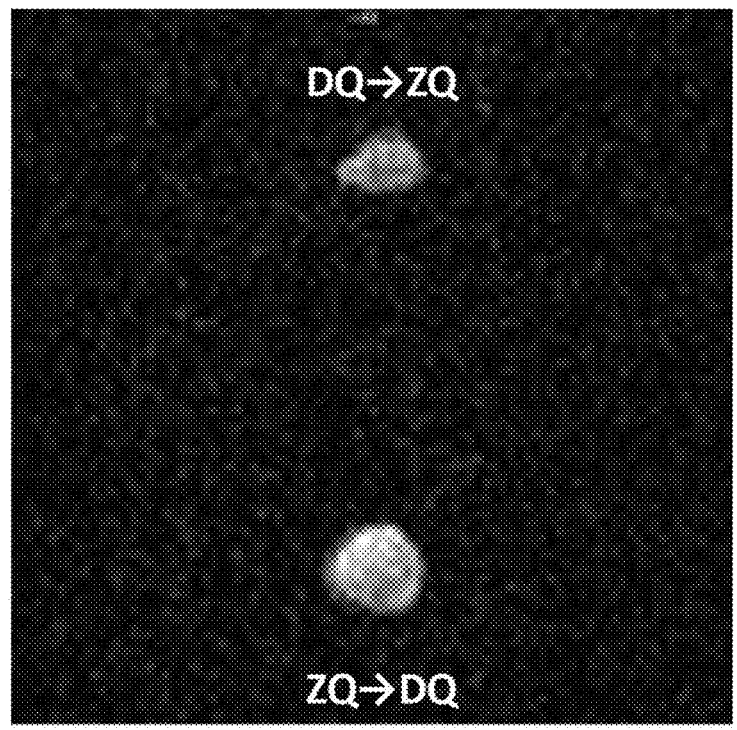
FIG. 8A illustrates a Fast pi-SSelMQC lactate imaging from yogurt juice to detect both MQ-coherence transfer pathways in the presence of a read gradient, permitting recovery of the lost 50% lactate signal.[2] Number of scans=1; scan time=2:24 is much shorter than the corresponding CSI SSel-MQC experiment.
Figure 8B:
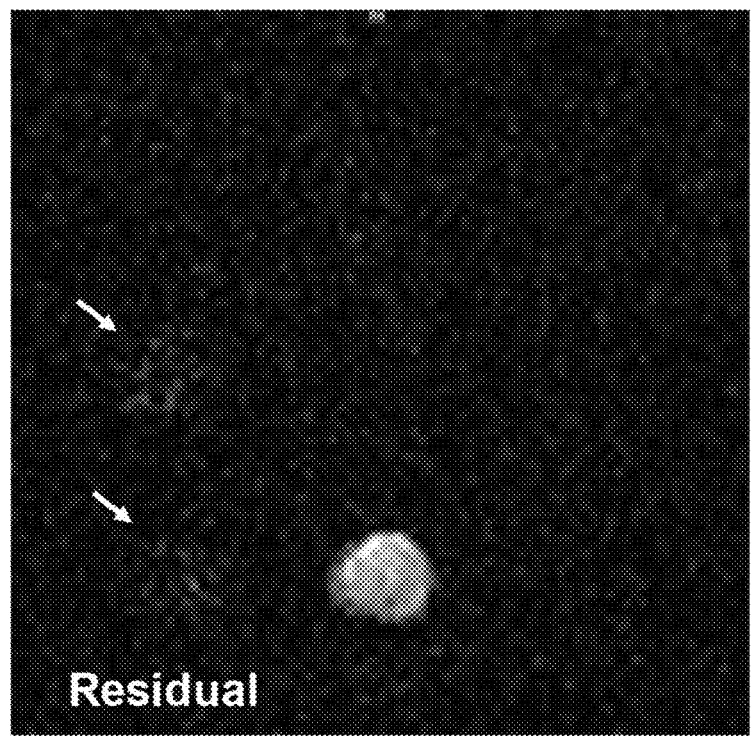
FIGS. 8B and 8C are images illustrating results of control experiments detecting one of the coherence transfer pathways. The transmitter frequency was set at the lactate resonance frequency; The parallel two loop coil was made in-house.
Figure 8C:
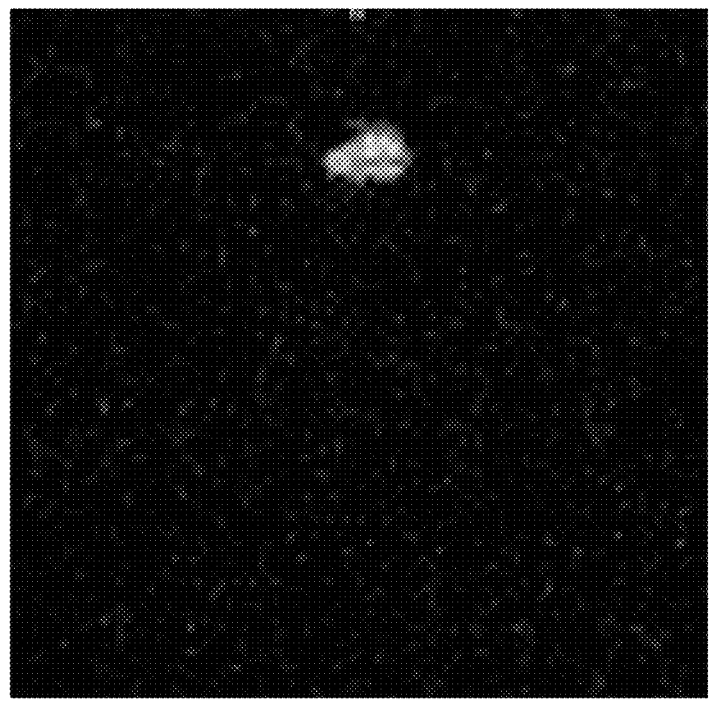
Figure 8D:
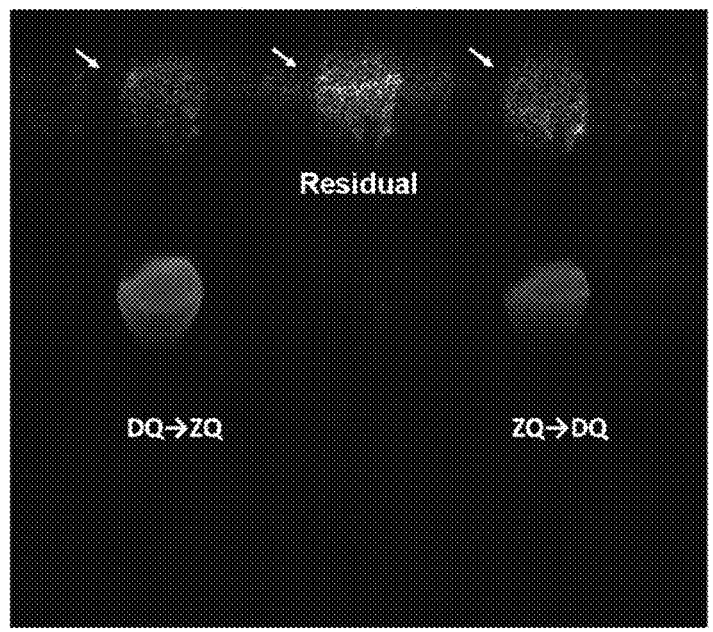
FIG. 8D illustrates similar lactate images from both coherence transfer pathways acquired at lower MQ-selection gradient strength. Number of scans=60. Image Size: 360×360, FOV=120 mm×120 mm.

When employing read-gradient (FIG. 6A), fast detection of the DQ→ZQ and ZQ→DQ pathways (FIG. 8A) or one of the MQ pathways (FIG. 8B, C) took only 2 min 24 sec. Detecting both MQ-coherence pathways using the pulse sequences in FIGS. 6A and 6B, however, may reintroduce lipid and water signals with gradient ratio $g_1:g_2:g_3=1:-1:2$ [FIG. 7B(a) and FIG. 7D]. To address the issue, we have designed the double-echo pi-SSelMQC sequences employing read-gradients (FIGS. 9A and 9D) to acquire two separate MQ-coherence transfer echoes [FIG. 9(B&C, E&F, H&I)]. The double-echo pi-SSelMQC permits excellent lipid and water suppression, similar to the original SSel-MQC experiments [FIG. 7B(b, c), 7E]. In addition, the biomarker signals from the two MQ-coherence pathways can be digitally added to recover the lost signal as in the original SSel-MQC experiments. The two MQ-transfer echoes are separated by $2t_1$ (FIG. 9G),[1] permitting insertion of gradient pulses between the two MQ-coherence transfer echoes. To further suppress spurious signals, the last 90° pulse was phase cycled in two steps' when number of scans NA≥2 (FIG. 8D and FIG. 9).

Figure 9A:
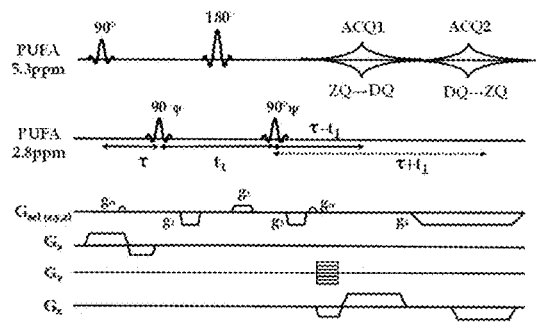
FIG. 9A illustrates an pi-SSelMQC pulse sequence that was used with a set of specific pulse sequence gradient parameters to obtain two separate lactate MQ-coherence transfer echoes from the two different MQ-coherence transfer pathways to recover 100% lactate in a yogurt phantom using a Doty 25 mm volume coil.
Figures 9B, 9C:
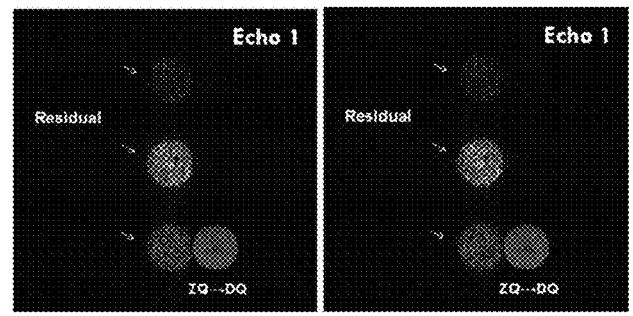
FIGS. 9B and 9C are the lactate MQ-coherence transfer echoes produced by the pulse sequence in FIG. 9A, shifted away from spurious residual water signals.
Figure 9D:
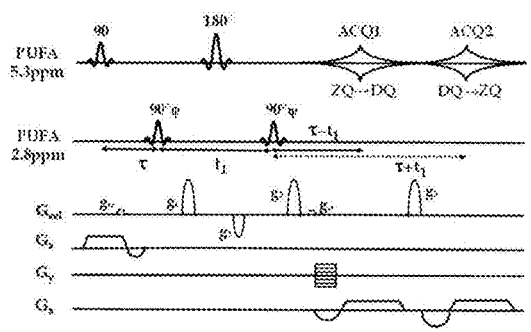
FIG. 9D illustrates a double-echo pi-SSelMQC pulse sequence to detect the two MQ-coherence transfer echoes of PUFA in a soybean oil phantom using a Doty 25 mm volume coil in an axial slice.
Figures 9E, 9F:
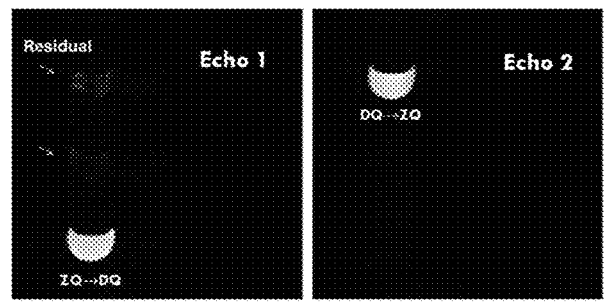
FIGS. 9E and 9F are the MQ-coherence transfer echoes produced using the pulse sequence in FIG. 9D on the soybean oil phantom.
Figure 9G:
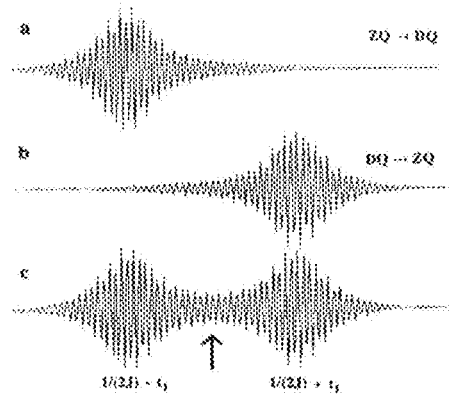
FIG. 9G illustrates the shifting of MQ-coherence transfer echoes in SSel-MQC, which was demonstrated using a 2M lactate solution in D20 on a 4.7T MRI spectrometer.[2] Selection of the ZQ→DQ (a) or DQ→ZQ (b) pathway results in a left or right shift of the echo by $t_1$ (24 ms), respectively. Selection of both pathways (c) leads to a double echo separated by $2t_1$ (48 ms). Thus, the two echoes can be acquired in separate acquisition windows in FIG. 9A-F, H-I.
Figures 9H, 9I:
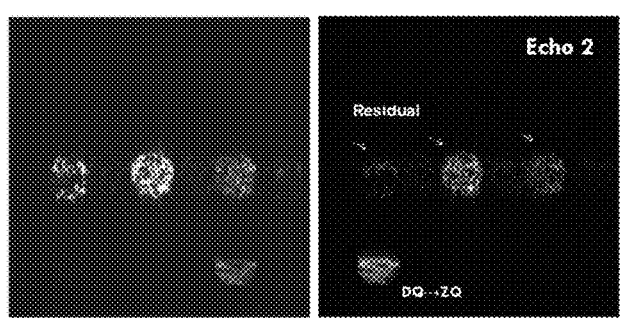
FIGS. 9H and 9I are MQ-coherence transfer echoes produced by applying the pulse sequence in FIG. 9D to lactate in yogurt in a coronal slice using a small gap resonator. Residual lipid and water are separated from the biomarker images. Note that complete lipid and water suppression is achievable with stronger MQ-coherence selection gradients.

In FIG. 9A a pi-SSelMQC pulse sequence that was used with a set of specific pulse sequence gradient parameters to obtain two separate lactate MQ-coherence transfer echoes to recover 100% lactate (FIGS. 9B and 9C) in a yogurt phantom using a Doty 25 mm volume coil. In FIG. 9D the double-echo pi-SSelMQC pulse sequence to detect the two MQ-coherence transfer echoes of PUFA in the soybean oil phantom using a Doty 25 mm volume coil in an axial slice (FIGS. 9E and 9F) and that of lactate in yogurt in a coronal slice using a small gap resonator (FIGS. 9H and 9I). Residual lipid and water are away from the biomarker images. Note that complete lipid and water suppression is achievable with stronger MQ-coherence selection gradients. In FIG. 9G the MQ-coherence transfer echo shifts in SSel-MQC were demonstrated using a 2M lactate solution in D20 on a 4.7T MRI spectrometer.[1] Selection of the ZQ→DQ (a) or DQ→ZQ (b) pathway results in a left or right shift of the echo by $t_1$ (24 ms), respectively. Selection of both pathways [FIG. 9G(c)] leads to a double echo separated by $2t_1$ (48 ms).

Figure 10C:
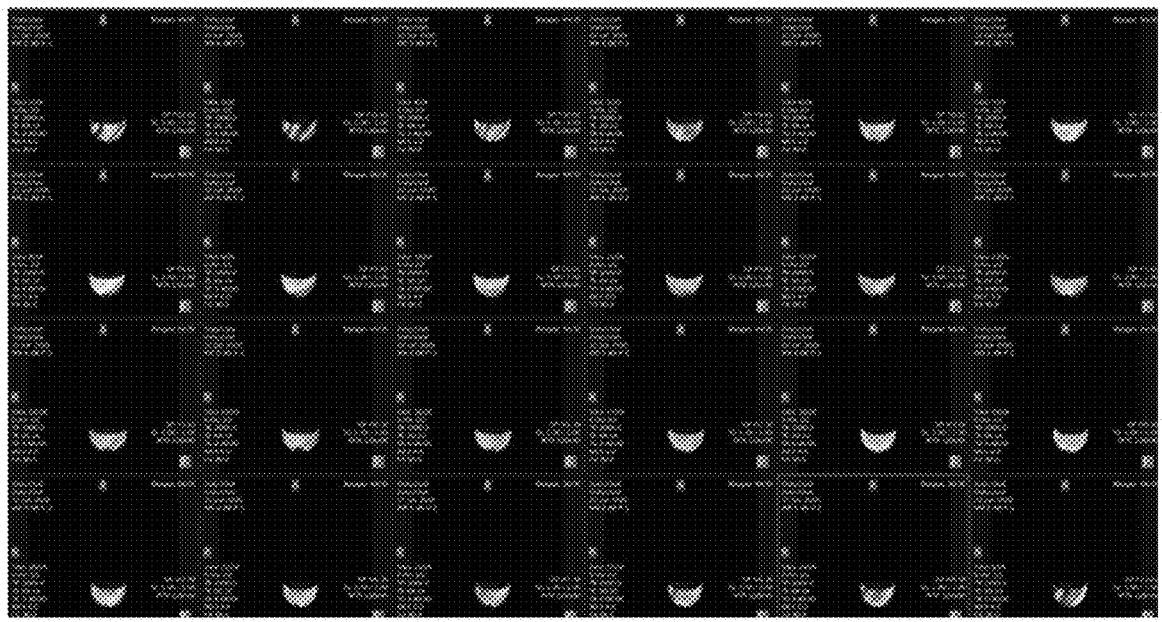
FIG. 10C illustrates the localization of 24 slices in FIGS. 10B(1) and 10B(2) using the images obtained from a standard Bruker localizer sequence.
Figure 10C:
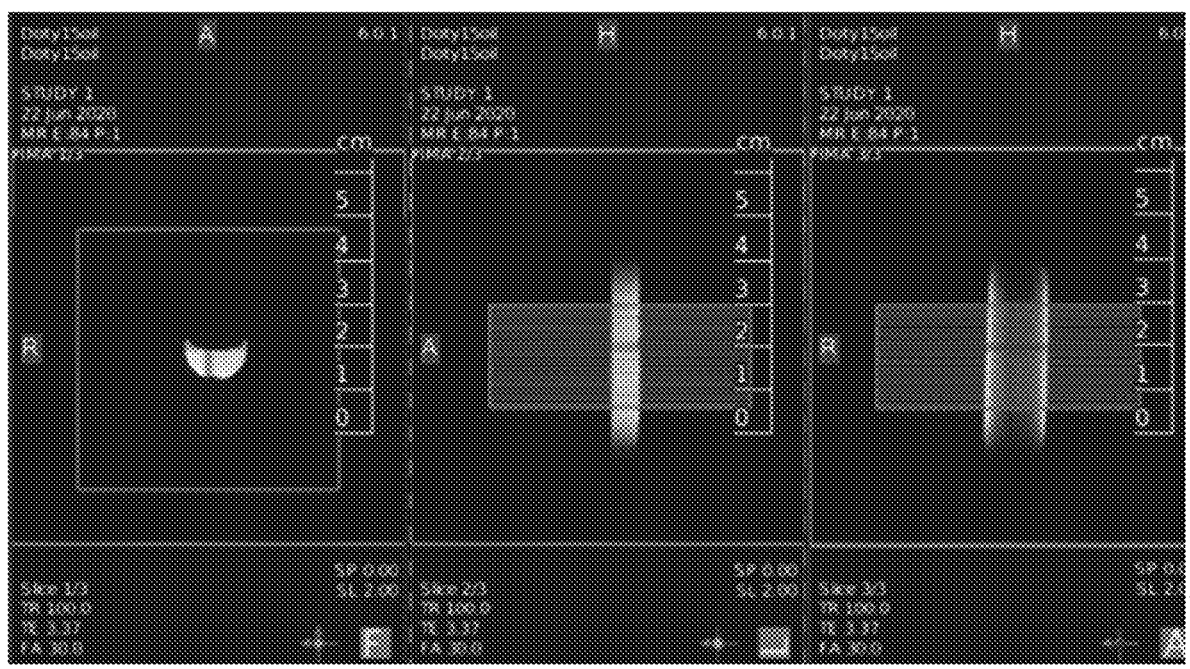

We have also acquired multi-slice pi-SSelMQC images by applying a phase-encoding gradient in the direction of slice-selective gradient (FIG. 10A—pulse sequence) and FIG. 10B(1)-10C—data). On the Bruker 9.4T MRI spectrometer, Multi-slice PUFA images from both DQ→ZQ and ZQ→DQ pathways were acquired in a preliminary 3D pi-SSelMQC experiment in separate MQ-coherence transfer echoes [FIGS. 10(B)(1) and 10(B)(2)] to recover full PUFA signals from the soybean oil in a 15 mL conical tube using the 25 mm Doty volume coil. Number of axial slices=24 as defined in FIG. 10C using the standard Bruker localization images acquired from the oil sample. Slice thickness=1 mm. FOV=60×60×24 $mm^3$, Image size: 128×90×24 $mm^3$, and in-plane resolution is 0.5 mm×0.67 mm of each PUFA image. Number of scans=4. The image artifacts can be removed by fine-tuning the pulse sequence parameters and optimizing the refocusing and spoiling gradient amplitudes. Similarly, lactate images from 16 slices were obtained in a 3D pi-SSelMQC experiment on the 9.4T MRI scanner from a non-fat yogurt in 20 mL syringe [FIGS. 10D(1) and 10D(2)] to recover both (1) the ZQ→DQ coherence transfer pathway (echo 1) and (2) the DQ→ZQ coherence transfer pathway (echo 2). The 25 mm Doty volume coil was used. Image matrix size=128×54×16 and FOV=90×90×48 $mm^3$. The slice thickness=3 mm, and in-plane resolution=0.703 mm×1.667 mm×3 mm. Repetition time RT=2000 ms, Scan time=11 hr31 min12 s. A Gauss pulse of 8.05 ms was used as the frequency selective 90° and 180° pulse with an excitation bandwidth of 200 Hz. The 90° slice selective pulse was a Bruker calculated SLR pulse of 1.05 ms with an excitation bandwidth of 4000 Hz. The spectral bandwidth=6313.1 Hz. Repetition delay=2 sec, Receiver gain=101. Number of echo images=2. Read Orientation: Left to Right. MQ-preparation time=68 ms. The MQ-selection gradients $g_1:g_2:g_3=-18\%:15\%:-30\%$ and Crusher Gradient $g_\alpha=-12\%$, with the same duration of 1.2 ms. The phase encoding gradient duration=0.420 ms in both slice selection direction ($G_x$) and phase encoding direction ($G_y$). Only the phase encoding gradient $G_y$ was synchronously incremented with the RF phase increment steps. The acquisition duration was 20.27 ms, during which read gradients ($G_z$) were applied. The transmitter frequency was set at lactate $CH_3$ proton resonance at 1.3 ppm, which has −1360 Hz offset to water resonance. Thus, the selective 180° pulse offset on lactate $CH_3$ proton=0, and selective 90° pulse offset on lactate CH proton=1160 Hz. A TR spoiler gradient was applied between scans. The multi-slice capability of the pi-SSel-MQC is clearly demonstrated by the results in FIGS. 10(B)(1), 10(B)(2), 10(D)(1) and 10(D)(2).

Conclusion

With synchronized RF phase incrementation of the selective RF pulses and the phase-encoding gradients, we have demonstrated that the 3D pi-SSelMQC method can recover full biomarker signals in phantoms and in mouse tumors in vivo. We have also developed the phase incrementing hard SEE-SelMQC (pi-SEE-HSelMQC) method to resolve overlapping biomarker images employing read-gradients.

The disclosure of each of the following references is hereby incorporated herein by reference in its entirety.

REFERENCES

1. Qiuhong He et al., "Single Scan In Vivo Lactate Editing with Complete Lipid and Water Suppression by Selective Multiple Quantum Coherence Transfer with Application in Tumors," J. Magn. Reson., Series B 106, 203-11 (1995).
2. Qiuhong He et al., "Proton Observation of the Antineoplastic Agent Iproplatin In Vivo by Selective Multiple Quantum Coherence Transfer (Sel-MQC)," Mag. Reson. Med. 33, 414-16 (1995).
3. Qiuhong He et al., "In Vivo MR Spectroscopic Imaging of Polyunsaturated Fatty Acids (PUFA) in Healthy and Cancerous Breast Tissues by Selective Multiple-Quantum Coherence Transfer (Sel-MQC)—A Preliminary Study," Magn. Reson. Med. 58, 1079-1085 (2007).
4. He Zhu et al., "The Fast Spiral-SelMQC Technique for In Vivo MR Spectroscopic Imaging of Polyunsaturated Fatty Acids in Human Breast Tissue," Magn. Reson. Med. 67, 8-19 (2012).
5. Qiuhong He, "Simultaneous mapping of multiple chemicals with suppression of unwanted signals via molecular specific coherence (MSC)-SelMQC (selective multiple quantum coherence)," U.S. Pat. No. 9,285,443.

6. Qiuhong He, "Selective zero-quantum coherence transfer (Sel-ZQC) method for metabolite imaging in a poorly shimmed magnetic field without susceptibility artifact," U.S. Pat. No. 9,733,326.

Data Supporting In Vivo Detection of Choline and Lactate and Detection of NAD

The following section describes results from using the pi-SEE-HSelMQC imaging pulse sequence to detect choline and lactate in vivo as well as to detect NAD in a conical tube, but the same methodology for detecting NAD ex vivo is believed to be extensible to detect NAD in vivo.

Figure 11A:
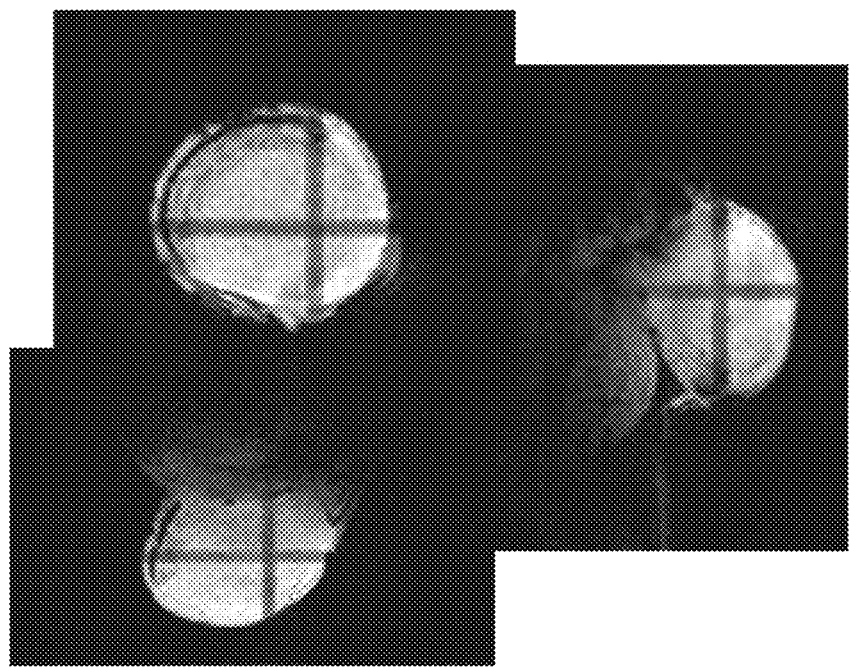
FIG. 11A illustrates $T_1$-weighted MRI images in three orthogonal dimensions of a flank PC3 tumor (a human prostate tumor model) in Athymic nu/nu mouse.

In vivo 2D pi-SEE-HSelMQC imaging with the frequency-encoding read-gradient (FIG. 1A) was carried out on a PC3 prostate tumor grown in the right flank of nu/nu mouse (FIG. 11A). The tumor lactate and choline images were detected with opposite image offsets away from the image center (FIG. 11B), due to $-10°$ and $10°$ phase increments of the choline selective RF pulse and the last lactate CH selective RF pulse, respectively, in synchronization with the phase encoding steps. The residual water and lipid signals stay at the image center, not overlapping with the resolved lactate and choline images. Tumor size: $16.05 \text{ mm} \times 12.50 \text{ mm} \times 8.31 \text{ mm}$. Bandwidth=5000 Hz and acquisition duration was 6.4 ms. Image matrix size=32×54, FOV=90×90 $\text{mm}^2$, imaging resolution=2.813×1.667 $\text{mm}^2$. The gradient ratio $g_0:g_1:g_2:g_3=12\%:0:-12\%:24\%$ and $g_{cr}=5\%$, with an equal gradient duration of 1 ms. The entire PC3 tumor was imaged in coronal slice orientation.

Figure 11B:
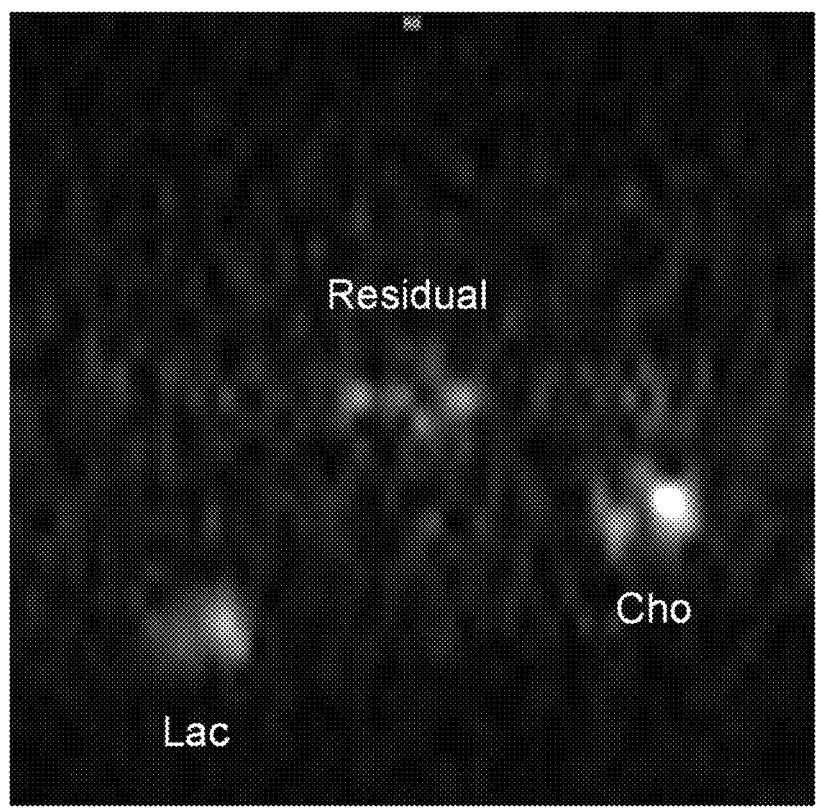
FIG. 11B illustrates the in vivo lactate and choline images acquired from the tumor are resolved with opposite image offsets introduced in the pi-MRSI experiment, away from the residual water/lipid image at the image center. Tumor size: 16.05 mm×12.50 mm×8.31 mm. Slice orientation: coronal.

The detailed pi-MRSI parameters used to obtain the images in FIG. 11B are as follows: Coronal slice thickness=9 mm, Read gradient orientation: Ro-Cd. Image size: 32×54, FOV: 90×90 $\text{mm}^2$, Resolution: 2.813 mm×1.667 mm. Number of Averages=10, repetition time=2000 ms, Total scan time: 18 min. Gradient $g_0=12\%$, $g_2=-12\%$, $g_3=24\%$, $g_{cr}=5\%$ at gradient duration of 1 ms. Dummy scan=0, Bandwidth=5000 Hz, MQ-preparation Time=68 ms, MQ-Echo shift delay=0. Only first order shimming was performed. The 90° excitation pulse for Cho, Lac $CH_3$ and Lac CH protons is a gauss.rfc pulse of 8.05 ms with an excitation bandwidth of 200 Hz, (Sharpness=3 defined by Bruker PV6 9.4T). The slice-selective refocusing 180° pulse is the SLR Calculated pulse from the Bruker shaped pulse library with a pulse duration of 0.68 ms and 5000 Hz RF excitation bandwidth (sharpness=3). Acquisition time=6.4 ms. Repetition spoiler gradient was used. MQ180 RFoffset=-1360 Hz (Lac $CH_3$), CHO_RFoffset=-600 Hz, MQ90 RFoffset (Lac CH)=-200 Hz.

Figure 12A:
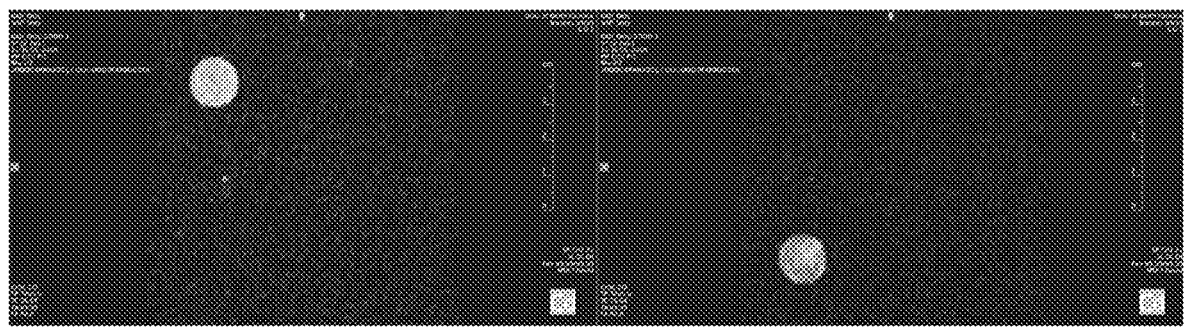
FIG. 12A illustrates the two NAD+ images from different MQ-coherence transfer echoes are shifted with opposite signs of image offset acquired in two different acquisition windows for full NAD$^+$ signal detection. Slice thickness=30 mm.
Figure 12B:
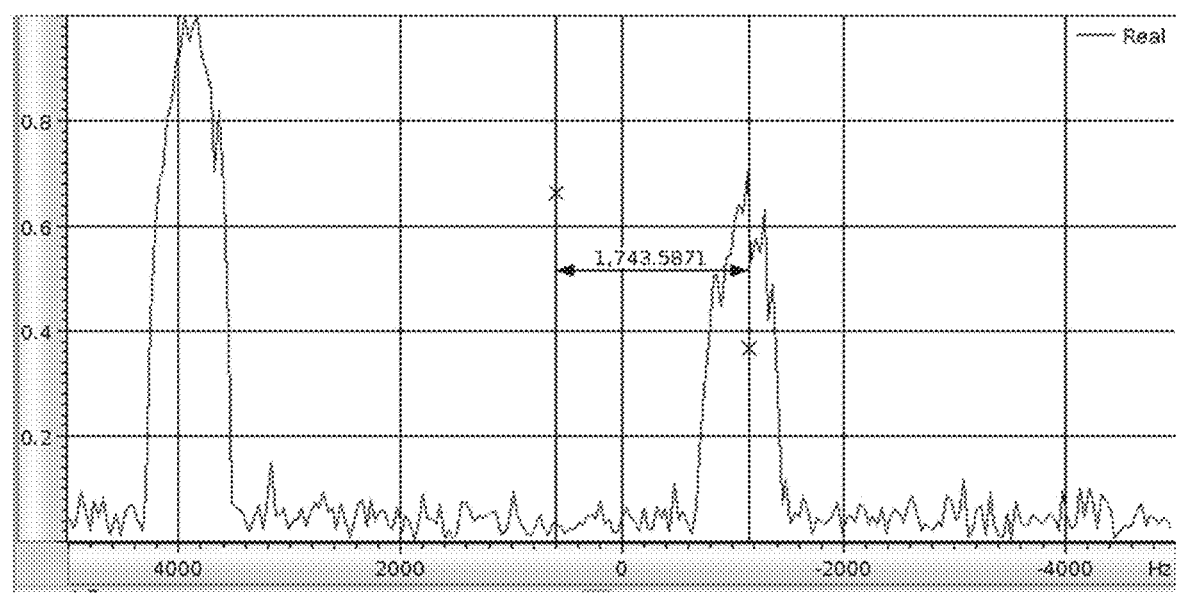
FIG. 12B is a graph illustrating the image profiles of the two NAD echoes from the two different MQ coherence transfer pathways.

MRSI Images of Nicotinamide Adenine Dinucleotide (NAD+) at 9.4T:

Double Echo pi-SSelMQC images of NAD+ using the pulse sequence displayed in FIG. 9D were obtained from 51 mM NAD+ in saline in a 15 mL conical tube using a Doty quadrature volume RF coil. Detailed pi-MRSI parameters: Repetition time=3000 ms, Number of averages=1, Slice orientation: Axial, and slice thickness=30 mm. Read orientation: Left-Right. Image size: 128×90 and FOV 90×90 $\text{mm}^2$, which gives the image resolution of 0.703×1.0 $\text{mm}^2$. Dummy scan=0, Echo images=2. Bandwidth=5000 Hz, Acquisition duration=25.6 ms. MQ-Preparation time=62.19 ms, MQ-Echo shift delay=0. Phase encoding gradient duration=0.35 ms, MQ-selection gradient and crusher gradient duration=1 ms. The coherence selection and crusher gradients: $g_1=-4\%$, $g_2=3\%$, $g_3=-6\%$, $g_{cr}=-4\%$. Auto repetition spoiler gradients were applied to remove spurious signals. Only first order shimming was performed. The slice-selective 90° excitation pulse (1.05 ms duration and 4000 Hz excitation bandwidth) was applied at NAD+ proton resonant frequency at 8.21 ppm (1388 Hz from water resonance). The second 90° Gaussian frequency-selective pulse was applied at NAD proton at 8.84 ppm, which is J-coupled to the NAD+ proton at 8.21 ppm (MQ90 RFoffset=1644 Hz). The RF pulse duration was 12 ms to give 134.2 Hz excitation bandwidth. The frequency-selective refocusing 180° pulse was also a Gaussian frequency-selective pulse with a pulse duration of 12 ms and 134.2 Hz RF excitation bandwidth (MQ180 RFoffset=1388 Hz). The RF phase of the last selective 90° pulse was phase-incremented in 10° in synchronization with the spatial phase-encoding gradient steps to separately acquire the MQ-coherence transfer echoes from the two different MQ-coherence transfer pathways for full $NAD^+$ signal recovery. FIG. 12A illustrates the two NAD+ images from different MQ-coherence transfer echoes are shifted with opposite signs of image offset acquired in two different acquisition windows for full $NAD^+$ signal detection. Slice thickness=30 mm. FIG. 12B is a graph illustrating the image profiles of the two NAD echoes from the two different MQ coherence transfer pathways.

The following section describes a proposed methodology for In vivo pi-MRSI imaging of oncometabolite 2-hydroxyglutarate in glioma mouse models.

Specific Aims

The overall goal is to develop the phase-incrementing Magnetic Resonance Spectroscopic Imaging (pi-MRSI) methods for in vivo imaging of oncometabolite 2-hydroxyglutarate (2-HG) in glioma xenograft mouse models carrying isocitrate dehydrogenase 1 (IDH1) mutation and monitoring 2-HG change as a non-invasive imaging biomarker for IDH1 inhibition. Glioma is the most common brain tumor, representing more than 50% of all brain tumors. Recent studies have shown that IDH mutation is prevalent in glioma, resulting in the production of 2-HG, which disrupts dioxygenase-dependent regulatory molecular events including epigenetic remodeling and DNA repair, driving oncogenic processes and tumor metabolic reprogramming. As the IDH mutations become new drug targets for glioma, 2-HG can be the biomarker to access IDH-targeted treatment efficacy. Among different imaging modalities, MR spectroscopy imaging (MRSI) has shown promise to track 2-HG (5-35 mM) and other metabolites in glioma. The major roadblocks for clinical applications of the current MRS methods include severe signal overlapping with other metabolites (e.g., glutamate) and macromolecules resulting in poor quantitative accuracy or false positive 2-HG detection. In vivo two-dimensional (2D) correlation spectroscopy has been applied to reveal a non-overlapping 2-HG cross peak at 4.02/1.91 ppm from $H_\alpha$ and $H_\beta$ protons in a anaplastic astrocytoma ($IDH1^{R132C}$) patient,[1] but the long data acquisition time has limited its clinical usage. The 2-HG $H_\alpha$ and $H_\beta$ proton pair has been used in the J-difference MRS to produce "clean" 2-HG signal by spectral subtraction of two MEGA-LASER measurements; however, the method is subject to 2-HG detection errors from patient motions and instrument instability. Sophisticated real time shimming and motion correction has been applied to reduce motion artifacts in the MEGA-LASER difference spectroscopic imaging of 2-HG,[2] permitting longitudinal monitoring of rapid 2-HG level drop (70%) in glioma patients following IDH1 inhibitor treatment.[3] However, such acquisition method is highly technical demanding and practically challenging in routine clinical exams. We need a better MRSI method to measure 2-HG with more accuracy, less artifacts, and reduced imaging time.

Here we propose to develop a novel pi-MRSI imaging method for measuring 2-HG, as well as choline as a companying biomarker in mouse models of glioma. The pi-MRSI will use novel phase-incrementing strategies: different molecular specific RF pulses will have different phase increments in synchronization with gradient phase-encoding steps. This introduces different image offsets to resolve tumor marker images, permitting application of read-gradient to reduce MRSI imaging time or improve SNR and spatial resolution for 2-HG and choline imaging. The new pi-MRSI method is designed to achieve single-scan suppression of background signals using selective multi-quantum editing and is not susceptible to motion and instrument artifacts. We have conducted preliminary pi-MRSI experiments to show feasibility in resolving lactate and choline images in 1.48 min from a yogurt phantom, about 16-32 times faster than CSI method using frequency-encoding in Cartesian k-space mapping. In the proposed study, we will further develop the pi-MRSI method for in vivo 2-HG imaging. The new pi-MRSI method will be compared with the standard multi-voxel MRSI based on Chemical Shift Imaging (CSI) technique in terms of SNR, spatial resolution, and imaging time, as well as effective background signal suppression without motion and instrument artifacts (Aim-1). The absolute quantification procedures of pi-MRSI will also be developed and validated (Aim-1). In vivo evaluation will be conducted in mouse models of glioma (Aim-2). The two specific aims are presented below.

Aim 1: To develop fast pi-MRSI method for quantitative imaging of 2-hydroxyglutarate (2-HG) and choline (Cho) in phantoms with single scan background signal suppression. The pi-MRSI sequence will be developed employing selective multi-quantum editing for background signal suppression and simultaneous imaging of tumor markers 2-HG and Cho. Imaging will be compared to the 2D CSI methods with 16 phase encoding steps in each dimension. In absolute metabolite quantification of 2-HG and Cho, $T_1/T_2$ pi-MRSI methods will be developed for relaxation time measurement while employing the established $B_1$ field mapping methods using biomarker standard phantoms containing 20 mM, 10 mM, 5 mM, 2 mM and 1 mM of 2-HG and Cho, mixed with other brain metabolites and lipid in physiological concentrations to mimic the in vivo chemical environment. Expected outcome: The new pi-MRSI method can clearly resolve 2-HG and choline signal from the mixed metabolites. The measured 2-HG and choline values are linearly correlated with the prepared concentrations without background contamination. When compared to the conventional 16×16 2D CSI method, the new pi-MRSI sequence will achieve 16-fold scan time reduction in Cartesian k-space mapping, which is an equivalent of 4 times SNR gain in the same scan time.

Aim 2: To evaluate pi-MRSI measurement of 2-hydroxyglutarate (2-HG) and choline (Cho) in U87 human glioblastoma xenograft mouse models in vivo. U87 human glioblastoma (GBM) parent cell line (U87/WT) and U87 GBM with IDH1 R132H mutation (U87/IDH1$^{R132H}$) will be used to form subcutaneous xenograft model of GBM in mice for pi-MRSI imaging evaluation. Three groups of mice will be included (n=10 each): U87/WT, U87/IDH1$^{R132H}$, and U87/IDH1$^{R132H}$ treated with an FDA approved IDH1 inhibitor Ivosidenib (Tibsovo®), representing three different levels of 2-HG. The pi-MRSI will be performed to image the quantity and spatial distributions of 2-HG and choline in tumor tissues. The tumor tissues will be harvested and snap-frozen after imaging, and metabolite concentrations will be measured in tumor extracts using NMR method to validate in vivo pi-MRSI results. Expected outcome: Compared to U87/WT, higher 2-HG concentration will be detected in U87/IDH1$^{R132H}$ tumors, and 2-HG level will drop after IDH1 inhibitor treatment. The in vivo 2-HG/Cho measurements using the pi-MRSI method and those measured by the ex-vivo NMR method will be within 5% error range.

Success of the project will prompt direct clinical translation of the new fast metabolite pi-MRSI in glioma patients for diagnosis and treatment monitoring, particularly using 2-HG as the biomarker for IDH mutant genotyping in human cancers.

The disclosure of each of the following references is incorporated herein by reference in its entirety.

REFERENCES

1. Andronesi, O. C., et al. Detection of 2-Hydroxyglutarate in IDH-mutated Glioma Patients by Spectral-editing and 2D Correlation Magnetic Resonance Spectroscopy. *Sci. Transl. Med.* 4 (2012).
2. Bogner, W., et al. 3D GABA imaging with real-time motion correction, shim update and reacquisition of adiabatic spiral MRSI. *Neuroimage* 103, 290-302 (2014).
3. Andronesi, O. C., et al. Treatment response assessment in IDH-mutant glioma patients by non-invasive 3D functional Spectroscopic Mapping of 2-Hydroxyglutarate. *Clin Cancer Res.* 22, 1632-1641 (2016).

Figure 13:
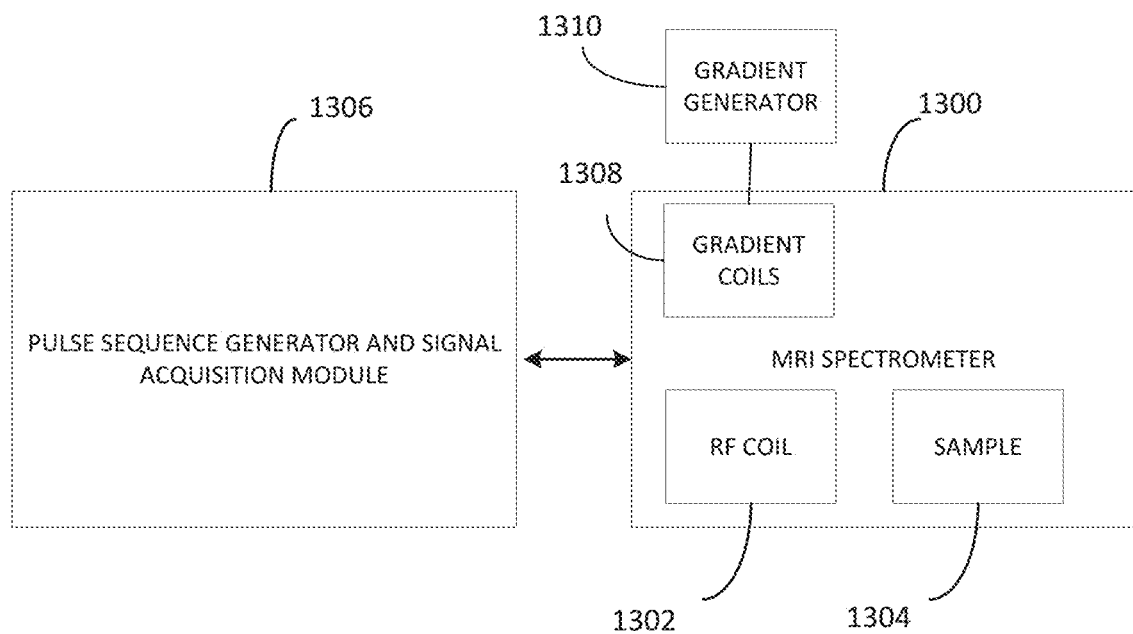
FIG. 13 is a block diagram illustrating an exemplary system for in vivo phase-incrementing MRSI.

FIG. 13 is a block diagram illustrating an exemplary system for in vivo phase incrementing MRSI according to the subject matter described herein. Referring to FIG. 13, the system includes an MRI spectrometer 1300 including a radio frequency (RF) coil 1302 designed to excite and detect signals from samples 1304. In the experiments above, the MRI spectrometer 1300 is a Bruker 9.4T BioSpec 94/30USR MRI spectrometer. Samples 1304 in the experiments above comprise lactate and choline or PUFA and choline samples. However, due to the speed at which images can be acquired using the methodology described herein, samples 1304 can be live subjects, including live animal or human subjects. As part of MRI spectrometer, a pulse sequence generator and signal acquisition module 1306 generates frequency-selective RF pulses for inducing multiple quantum coherences in chemical components of interest. For example, pulse sequence generator and signal acquisition module 1306 may generate the frequency-selective RF pulses illustrated in FIG. 1A to separately induce multiple-quantum coherences in lactate and single-quantum transitions in choline compounds. MRI spectrometer 1300 detects responses from induced multiple quantum coherences and single-quantum transitions in samples 1304 using the pulse sequences. MRI spectrometer 1300 may also include gradient coils 1308 and gradient generator 1310 for generating the gradients described herein.

Figure 14:
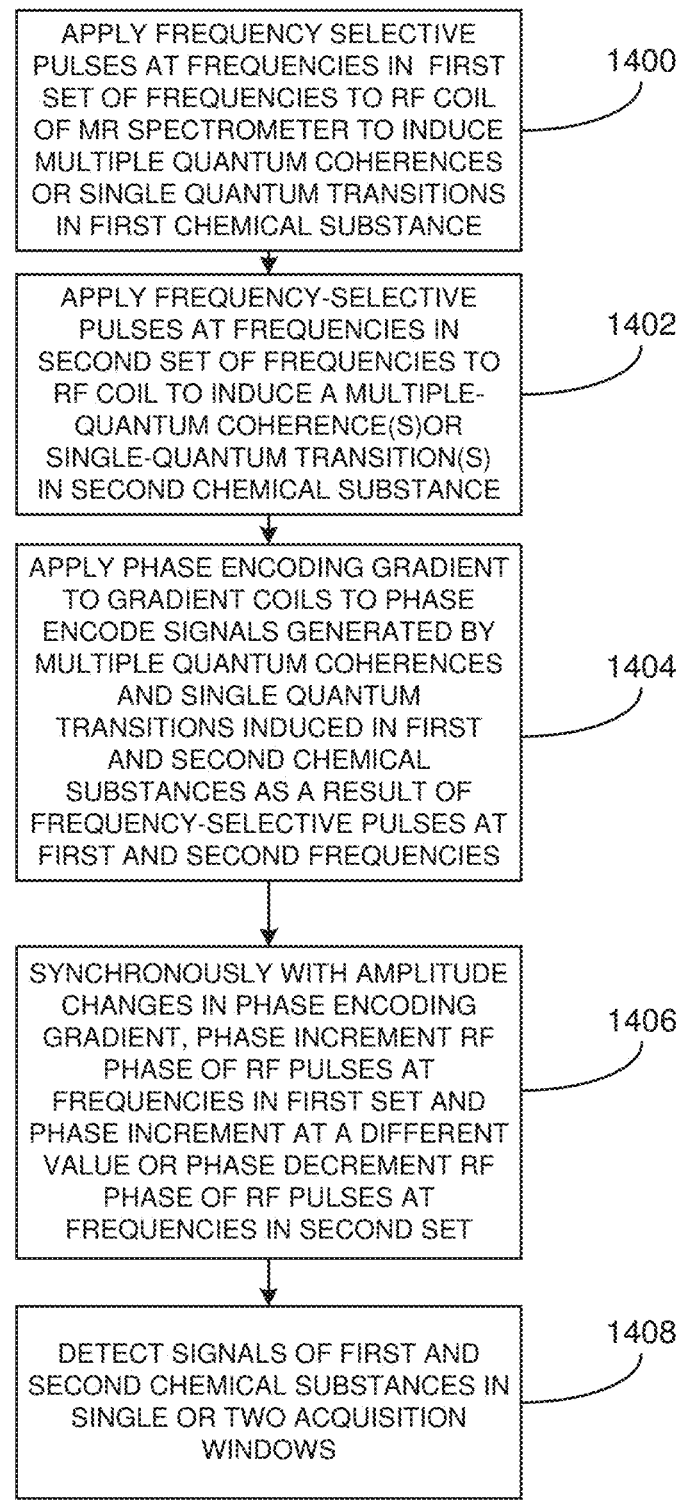
FIG. 14 is a flow chart illustrating an exemplary process for in vivo phase incrementing MRSI.

FIG. 14 is a flow chart illustrating an exemplary process for in vivo phase incrementing MRSI. Referring to FIG. 14, the process is performed on a sample in an MRI spectrometer. For example, a sample with unknown chemical composition may be placed in an MRI spectrometer. The sample may be a human, an animal, or a chemical or biological substance.

In step 1400, the process includes applying selective RF pulses at frequencies in a first set of frequencies to an RF coil of the MRI spectrometer to induce multiple quantum coherences and single quantum transitions in a first chemical substance in the sample. For example, pulse sequence generator and signal acquisition module 1306 may generate selective RF pulses at a frequency or frequencies that are selective for a particular chemical substance of interest, such as the frequency selective pulses labeled Lac 1.3 ppm and Lac 4.2 ppm illustrated in FIG. 1A and apply the frequency selective pulses to RF coil 1302 of MRI spectrometer 1300 to induce multiple quantum coherence in lactate molecules by exciting $CH_3$ and CH protons at the two different resonances of 1.3 ppm and 4.2 ppm.

In step 1402, the process includes applying frequency-selective pulses at frequencies in a second set of frequencies (different from the first set of frequencies) to the RF coil to induce single-quantum transitions and multiple quantum coherences in a second chemical substance of interest. For example, pulse sequence generator 1306 may generate frequency-selective pulses, such as the pulses labeled Cho 3.2 ppm in FIG. 1A and apply the frequency selective pulses for choline (or other substance of interest) to RF coil 1302 of MR spectrometer 1300 to induce single-quantum transitions in choline at its resonant frequency of 3.2 ppm and detect choline signal using the RF coil 1302 and the signal acquisition modules 1306 of the MRI spectrometer.

In step 1404, the process includes applying a phase encoding gradient series to the gradient coils for phase encoding signals generated by multiple-quantum coherences and single-quantum transitions in the first and second chemical substances as a result of the frequency-selective RF pulses at the first and second frequencies. For example, gradient generator 1310 may excite gradient coils 1308 with a phase encoding gradient series, such as the y-gradient labeled $G_y$ in FIG. 1A to phase encode the signals generated by the multiple-quantum coherences and single-quantum transitions induced in lactate and choline. The multiple levels of the gradient pulse labeled $G_y$ indicates that the amplitude of the Y-gradient $G_y$ is being changed (incremented or decremented with each scan).

In step 1406, the process includes, synchronously with amplitude changes in the phase encoding gradient, incrementing the phase of RF pulses at frequencies in the first set and phase decrementing (or phase incrementing at a different value) of the phase of RF pulses at the frequencies in the second set. For example, pulse sequence generator and signal acquisition module 1306 may, as the amplitudes of the phase encoding gradient $G_y$ in FIG. 1A are changed, increment the RF phase of one of the two 90° pulses selectively exciting Lac 4.2 ppm by 10 degrees for each successive scan and decrement the RF phase of the choline-selective 90° pulse at 3.2 ppm by 10 degrees for each successive scan.

In step 1408, the process includes, detecting, during an image acquisition period, signals generated by the induced multiple quantum coherences and single-quantum transitions in the first and second chemical components as a result of the phase incremented RF pulses, the phase decremented RF pulses, and the phase encoding gradient. For example, pulse sequence generator and signal acquisition modules 1306 and RF coil 1302 may detect the signals illustrated by the peaks labeled Lac and Cho in FIG. 1A, because the image offsets generated make lactate and choline images sufficiently separated for fast k-space mapping schemes to reduce imaging time, as illustrated in FIG. 5A.

Figure 15:
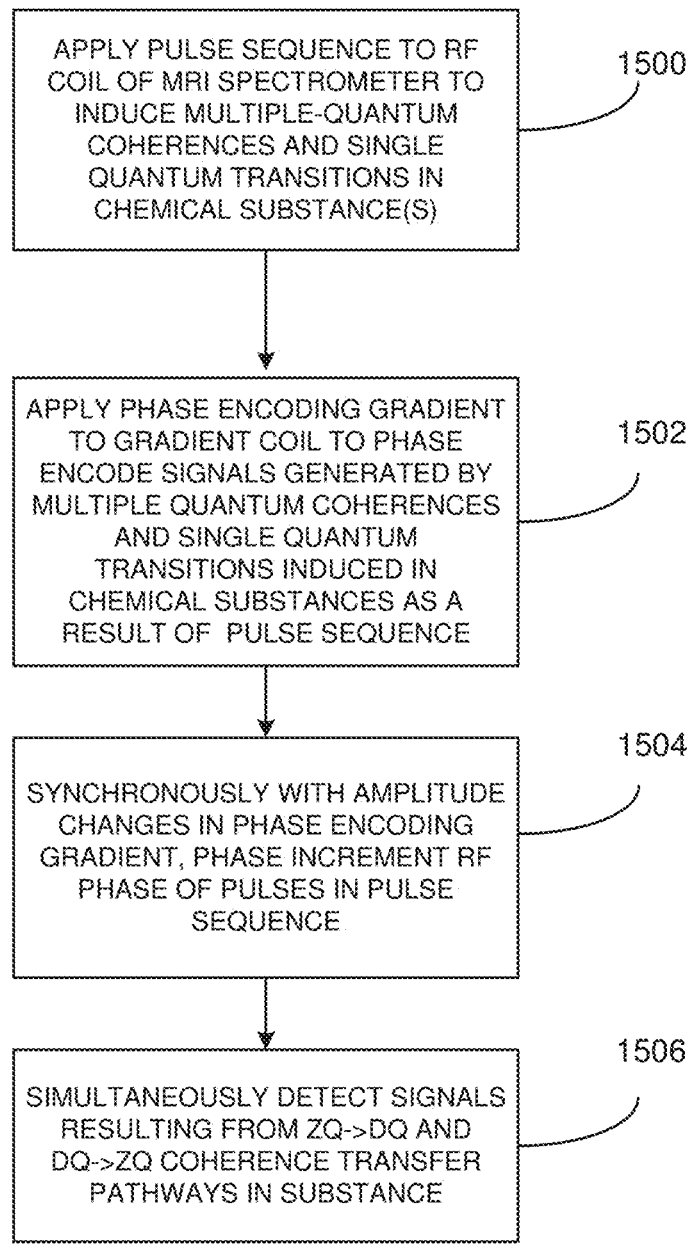
FIG. 15 is a flow chart illustrating an exemplary process for simultaneous ZQ→DQ and DQ→ZQ coherence transfer pathway imaging.

According to another aspect of the subject matter described herein, a method for simultaneous detection of zero quantum→double quantum (ZQ→DQ) and DQ→ZQ coherence transfer pathways in a chemical substance of interest is provided. FIG. 15 is a flow chart of such a method. Referring to FIG. 15, in step 1500, the process includes applying a pulse sequence to a radio frequency (RF) coil of a magnetic resonance imaging (MRI) spectrometer to induce multiple quantum coherences and single quantum transitions in a chemical substance(s) in a subject. For example, pulse sequence generator and signal acquisition module 1306 may apply the RF pulses labeled PUFA 5.3 ppm or PUFA 2.8 ppm illustrated in FIG. 6A or 6B to RF coil 1302 of MRI spectrometer 1300.

In step 1502, the process includes applying a phase encoding gradient to the gradient coil to phase encode signals generated by multiple quantum coherences induced in chemical substances as a result of the pulse sequences, wherein applying the phase encoding gradient includes varying the amplitude of the phase encoding gradient. For example, gradient generator 1310 may apply the y-gradient labeled $G_y$ in FIG. 6A or 6B to gradient coils 1308 of MRI spectrometer 1300.

In step 1504, the process includes, synchronously with the amplitude changes in the phase encoding gradient, phase incrementing an RF phase of a pulse in the pulse sequence. For example, pulse sequence generator and signal acquisition module 1306 may increment the phase of the second or last 90° pulse in the pulse sequences labeled PUFA 2.8 ppm in FIGS. 6A and 6B.

In step 1506, the process includes simultaneously detecting, during one of multiple image acquisition periods, signals resulting from DQ→ZQ and ZQ→DQ quantum coherence transfer pathways in the chemical substance for each incremented RF phase and the phase encoding gradient. For example, pulse sequence generator and signal acquisition module 1306 may detect both the phase-modulated signals from the DQ→ZQ and ZQ→DQ coherence transfer pathways illustrated on the line labeled PUFA 5.3 ppm illustrated in FIGS. 6A and 6B.

It will be understood that various details of the presently disclosed subject matter may be changed without departing from the scope of the presently disclosed subject matter. Furthermore, the foregoing description is for the purpose of illustration only, and not for the purpose of limitation.

What is claimed is:

1. A method for in vivo phase incrementing magnetic resonance spectroscopic imaging (MRSI), the method comprising:

applying frequency-selective RF pulses at frequencies in a first set of frequencies to a radio frequency (RF) coil of a magnetic resonance imaging (MRI) spectrometer to induce multiple quantum coherences and single-quantum transitions in a first chemical substance in a subject;

applying frequency-selective RF pulses at frequencies in a second set of frequencies to the RF coil to induce multiple quantum coherences and single quantum transitions in a second chemical substance in the subject;

applying a phase encoding gradient to the gradient coil to phase encode signals generated by the multiple quantum coherences and single-quantum transitions induced in the first and second chemical substances as a result of the frequency-selective RF pulses, wherein applying the phase encoding gradient includes varying an amplitude of the phase encoding gradient;

synchronously with amplitude changes in the phase encoding gradient, phase incrementing phases of pulses of the frequency selective RF pulses at the frequencies in the first set of frequencies and phase decrementing or phase incrementing differently phases of the frequency selective RF pulses at the frequencies in the second set of frequencies; and detecting, during an image acquisition period, signals generated by the induced multiple-quantum coherences or single-quantum transitions in the first and second chemical substances as a result of the phase incremented RF pulses at the frequencies in the first set of frequencies, the phase decremented or differently phase incremented RF pulses at the frequencies in the second set of frequencies, and the phase encoding gradient.

2. The method of claim 1 wherein the first chemical substance is a chemical without a spin coupling network and the second chemical substance is a biochemical with J-coupled proton spins.

3. The method of claim 2 wherein the first chemical substance comprises choline.

4. The method of claim 3 wherein the second chemical substance comprises lactate.

5. The method of claim 3 wherein the second chemical substance is a polyunsaturated fatty acid (PUFA).

6. The method of claim 3 wherein the second chemical substance is oncometabolite 2-hydroxyglutarate (2-HG).

7. A system for in vivo phase incrementing magnetic resonance spectroscopic imaging (MRSI), the system comprising:
a magnetic resonance imaging (MRI) spectrometer including a radio frequency (RF) coil; and
a pulse sequence generator and signal acquisition module for applying frequency selective RF pulses at frequencies in a first set of frequencies to the RF coil of the MRI spectrometer to induce multiple-quantum coherences and single-quantum transitions in a first chemical substance in a subject, applying frequency-selective RF pulses at frequencies in a second set of frequencies to the RF coil to induce multiple-quantum coherences or single-quantum transitions in a second chemical substance in the subject, applying a phase encoding gradient to the gradient coil to phase encode signals generated by the multiple quantum coherences or the single-quantum transitions induced in the first and second chemical substances as a result of the frequency-selective RF pulses at the frequencies in the first and second sets of frequencies, wherein applying the phase encoding gradient includes varying an amplitude of the phase encoding gradient, synchronously with amplitude changes in the phase encoding gradient, phase incrementing phases of the RF pulses at the frequencies in the first set of frequencies and phase decrementing or phase incrementing differently phases of the RF pulses at the frequencies in the second set of frequencies, and detecting, during an image acquisition period, signals generated by the induced multiple quantum coherences or single-quantum transitions in the first and second chemical substances as a result of the phase incremented RF pulses at the frequencies in the first set of frequencies, the phase decremented or differently phase incremented RF at the frequencies in the second set of frequencies, and the phase encoding gradient.

8. The system of claim 7 wherein the first chemical substance is a chemical without a spin coupling network and the second chemical substance is a biochemical with J-coupled proton spins.

9. The system of claim 8 wherein the first chemical substance comprises choline.

10. The system of claim 9 wherein the second chemical substance comprises lactate.

11. The system of claim 10 wherein the second chemical substance comprises a polyunsaturated fatty acid (PUFA).

12. The system of claim 10 wherein the second chemical substance comprises oncometabolite 2-hydroxyglutarate (2-HG).

13. A non-transitory computer readable medium having stored thereon executable instructions that when executed by a processor of a computer control the computer to perform steps comprising:
applying frequency-selective RF pulses at frequencies in a first set of frequencies to a radio frequency (RF) coil of a magnetic resonance imaging (MRI) spectrometer to induce multiple-quantum coherences and single-quantum transitions in a first chemical substance in a subject;
applying frequency-selective RF pulses at frequencies in a second set of frequencies to the RF coil to induce multiple-quantum coherences or single-quantum transitions in a second chemical substance in the subject;
applying a phase encoding gradient to the gradient coil to phase encode signals generated by the multiple-quantum coherences and single-quantum transitions induced in first and second chemical substances as a result of the frequency-selective pulses at the frequencies in the first and second sets of frequencies, wherein applying the phase encoding gradient includes varying an amplitude of the phase encoding gradient;
synchronously with amplitude changes in the phase encoding gradient, phase incrementing phases of the frequency-selective pulses at the frequencies in the first set of frequencies and phase decrementing or phase incrementing differently phases of the frequency-selective pulses at the frequencies in the second set of frequencies; and
detecting, during an image acquisition period, signals generated by the induced multiple-quantum coherences and single-quantum transitions in the first and second chemical substances as a result of the phase incremented RF pulses at the frequencies in the first set of frequencies, the phase decremented or differently phase incremented RF pulses at the frequencies in the second set of frequencies, and the phase encoding gradient.

14. A method for simultaneous detection of zero quantum→double quantum (ZQ→DQ) and DQ→ZQ coherence transfer pathways in a chemical substance of interest, the method comprising:
applying a pulse sequence to a radio frequency (RF) coil of a magnetic resonance imaging (MRI) spectrometer to induce multiple quantum coherences and single quantum transitions in a chemical substance in a subject;
applying a phase encoding gradient to the gradient coil to phase encode signals generated by multiple quantum coherences induced in a chemical substance as a result of the pulse sequence, wherein applying the phase encoding gradient includes varying an amplitude of the phase encoding gradient;
synchronously with amplitude changes in the phase encoding gradient, phase incrementing or phase decrementing a radio frequency (RF) phase of a pulse in the pulse sequence; and
simultaneously detecting, during at least one image acquisition period, signals resulting from DQ→ZQ and ZQ→DQ quantum coherence transfer pathways in the chemical substance.

15. The method of claim 14 the pulse sequence includes a plurality of 90° pulses and phase incrementing or decrementing the RF phase of the pulse includes phase incrementing or decrementing the phase of a second 90° pulse in the pulse sequence.

16. The method of claim 14 wherein the pulse sequence includes a plurality of 90° pulses and phase incrementing or decrementing the RF phase of the pulse includes phase incrementing or decrementing the phase of a last 90° pulse in the pulse sequence.

17. The method of claim 14 wherein the chemical substance is a chemical with a J-coupled proton spins.

18. The method of claim 17 wherein the chemical substances comprises a polyunsaturated fatty acid (PUFA), lactate, or nicotinamide adenine dinucleotide (NAD+).

19. A system for simultaneous detection of zero quantum→double quantum (ZQ→DQ) and DQ→ZQ coherence transfer pathways in a chemical substance of interest, the system comprising:
- a magnetic resonance imaging (MRI) spectrometer including a radio frequency (RF) coil; and
- a pulse sequence generator and signal acquisition module for applying a pulse sequence to the RF coil of the MRI spectrometer to induce multiple quantum coherences in a chemical substance in a subject, applying a phase encoding gradient to the gradient coil to phase encode signals generated by multiple quantum coherences induced in a chemical substance as a result of the pulse sequence, wherein applying the phase encoding gradient includes varying an amplitude of the phase encoding gradient, synchronously with amplitude changes in the phase encoding gradient, phase incrementing or phase decrementing an RF phase of a pulse in the pulse sequence, and simultaneously detecting, during at least one image acquisition period, signals resulting from DQ→ZQ and ZQ→DQ coherence transfer pathways in the chemical substance.

20. The system of claim 19 the pulse sequence includes a plurality of 90° pulses and phase incrementing or decrementing the RF phase of the pulse includes phase incrementing or decrementing the phase of a first 90° pulse in the pulse sequence.

21. The system of claim 19 wherein the pulse sequence includes a plurality of 90° pulses and phase incrementing or decrementing the RF phase of the pulse includes phase incrementing or decrementing the phase of a last 90° pulse in the pulse sequence.

22. The system of claim 19 wherein the chemical substance is a substance with a J-coupled proton spins.

23. The system of claim 22 wherein the chemical substances comprises a polyunsaturated fatty acid (PUFA), lactate, or nicotinamide adenine dinucleotide (NAD+).

24. A non-transitory computer readable medium having stored thereon executable instructions that when executed by a processor of a computer control the computer to perform steps comprising:
- applying a pulse sequence to a radio frequency (RF) coil of a magnetic resonance imaging (MRI) spectrometer to induce multiple quantum coherences and single quantum transitions in a chemical substance in a subject;
- applying a phase encoding gradient to the gradient coil to phase encode signals generated by multiple quantum coherences induced in a chemical substance as a result of the pulse sequence, wherein applying the phase encoding gradient includes varying amplitude of the phase encoding gradient;
- synchronously with amplitude changes in the phase encoding gradient, phase incrementing or phase decrementing an RF phase of a pulse in the pulse sequence; and
- simultaneously detecting, during at least one image acquisition period, signals resulting from DQ→ZQ and ZQ→DQ coherence transfer pathways in the chemical substance.

* * * * *

UNITED STATES PATENT AND TRADEMARK OFFICE
CERTIFICATE OF CORRECTION

PATENT NO. : 11,604,242 B2
APPLICATION NO. : 17/479270
DATED : March 14, 2023
INVENTOR(S) : Qiuhong He It is certified that error appears in the above-identified patent and that said Letters Patent is hereby corrected as shown below:

In the Specification

At Column 11, Line 38, please delete the phrase "to detect" and insert instead --detected--.

Signed and Sealed this
Thirteenth Day of February, 2024

Katherine Kelly Vidal
*Director of the United States Patent and Trademark Office*